(12) United States Patent
Nido et al.

(10) Patent No.: US 6,635,905 B2
(45) Date of Patent: Oct. 21, 2003

(54) GALLIUM NITRIDE BASED COMPOUND SEMICONDUCTOR LIGHT-EMITTING DEVICE

(75) Inventors: Masaaki Nido, Tokyo (JP); Masaru Kuramoto, Tokyo (JP); Atsushi Yamaguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/237,077

(22) Filed: Sep. 9, 2002

(65) Prior Publication Data

US 2003/0052316 A1 Mar. 20, 2003

(30) Foreign Application Priority Data

Sep. 7, 2001 (JP) .......................... 2001-272793

(51) Int. Cl.$^7$ .......................... H01L 33/00; H01L 31/101
(52) U.S. Cl. .......................... 257/103; 257/79
(58) Field of Search .................... 257/103, 79

(56) References Cited

U.S. PATENT DOCUMENTS

| 6,084,899 | A | * | 7/2000 | Shakuda |
| 6,133,590 | A | * | 10/2000 | Ashley et al. |
| 6,534,791 | B1 | * | 2/2003 | Hayashi et al. |

FOREIGN PATENT DOCUMENTS

| DE | 4313798 A1 | * | 11/1993 |
| JP | 2001057460 | | 2/2001 |
| JP | 2001057461 | | 2/2001 |
| JP | 2001085796 | | 3/2001 |

OTHER PUBLICATIONS

S. Nagahama et al., "High–Power and Long–Lifetime InGaN Multi–Quantum–Well Laser Diodes Grown on Low–Dislocation–Density GaN Substrates", Jpn. J. Appl. Phys. vol. 39, pp. L647–L650, Part 2, No. 7A, Jul. 2000.
S. Nakamura, et al., "Continuous–wave operation of InGaN/GaN/AlGaN–based laser diodes grown on GaN substrates", Applied Physics Letters, vol. 72, No. 16, pp. 2014–2016, Apr. 1998.

* cited by examiner

*Primary Examiner*—Stephen D. Meier
(74) *Attorney, Agent, or Firm*—Young & Thompson

(57) ABSTRACT

A light-emitting semiconductor device includes an active layer interposed between first-side and second-side cladding layer, and at least one of first-side and second-side optical guide layers. The following four equations are satisfied:

$$0.15 \leq h;$$

$$|x-y| \leq 0.02;$$

$$0.02 \leq x \leq 0.06; \text{ and}$$

$$0.34x - 0.49 \leq d1 + 2h,$$

where "h" is a total thickness of the first-side and second-side optical guide layers; "d1" is a thickness of the first-side cladding layer; "x" is a first Al-index of a first AlGaN bulk crystal which has a first refractive index equal to a first averaged refractive index of the first-side cladding layer; and "y" represents a second Al-index of a second AlGaN bulk crystal which has a second refractive index equal to a second averaged refractive index of the second-side cladding layer.

50 Claims, 10 Drawing Sheets full angle of aperture = 15 [degree]

horizontal radiation angle = 10 [degree]

GALLIUM NITRIDE BASED COMPOUND SEMICONDUCTOR LIGHT-EMITTING DEVICE

BACKGROUND OF THE INVENTION

1. Field of the Invention

The present invention relates to a gallium nitride based compound semiconductor device, and more particularly to a gallium nitride based compound semiconductor light emitting device with a reduced operating current and a reduced device resistance, for emitting a laser beam with a basic transverse mode and a generally circular shape of beam section.

All of patents, patent applications, patent publications, scientific articles and the like, which will hereinafter be cited or identified in the present application, will, hereby, be incorporated by references in their entirety in order to describe more fully the state of the art, to which the present invention pertains.

2. Description of the Related Art

The requirement for development of a gallium nitride based compound semiconductor laser with a reduced operating current and a reduced device resistance, for emitting a laser beam with a basic transverse mode and a generally circular shape of beam section has been on the increase. The semiconductor laser of this type has a high utilization efficiency of laser beam in applications to laser disks and laser printers. The high utilization efficiency of laser beam may realize a desired high laser power on a recording face and a desired high recording speed. The semiconductor laser of this type does not need an additional optical element for shaping a generally circular beam section. The absence of such additional optical element may realize a scaling down of the device and a reduction of the cost.

A gallium nitride based compound semiconductor laser, which emits a laser beam with a wavelength near 400 nanometers, has a focusing spot area which is smaller by three times than that of a red-color semiconductor laser, which emits a red-color laser beam with a wavelength near 650 nanometers. The smaller focusing spot area is advantageous in applying the laser to high density recording optical disks and laser printers.

A conventional gallium nitride based compound semiconductor laser will be described hereinafter with reference to the drawings. FIG. 1 is a fragmentary cross sectional elevation view of an example of the conventional gallium nitride based compound semiconductor laser. This laser is disclosed by S. Nakamura et al. in Applied Physics Letters, vol. 72, 1998, pp. 2014–2016. The conventional gallium nitride based compound semiconductor laser is formed over a GaN substrate 101 which has a thickness of 80 micrometers. An n-type GaN contact layer 102 with a thickness of 3 micrometers is provided over the GaN substrate 101. An n-type $In_{0.1}Ga_{0.9}N$ layer 103 with a thickness of 0.1 micrometer is provided over the n-type GaN contact layer 102.

An n-type super-lattice cladding layer 104 with a total thickness of 1.2 micrometers is provided over the n-type $In_{0.1}Ga_{0.9}N$ layer 103. The super-lattice comprises 240 periods of alternating laminations of an n-type GaN layer with a thickness of 2.5 nanometers and an n-type $Al_{0.14}Ga_{0.86}N$ layer with a thickness of 2.5 nanometers. An n-type GaN optical guide layer 105 with a thickness of 0.1 micrometer is provided over the n-type super-lattice cladding layer 104. An undoped multiple quantum well active layer 106 is provided over the n-type GaN optical guide layer 105. The multiple quantum well active layer 106 comprises 4 periods of alternating laminations of an undoped $In_{0.15}Ga_{0.85}N$ quantum well layer with a thickness of 2 nanometers and an undoped $In_{0.02}Ga_{0.98}N$ barrier layer with a thickness of 5 nanometers.

A p-type $Al_{0.2}Ga_{0.8}N$ layer 107 with a thickness of 20 nanometers is provided over the undoped multiple quantum well active layer 106. A p-type GaN optical guide layer 108 with a thickness of 0.1 micrometer is provided over the p-type $Al_{0.2}Ga_{0.8}N$ layer 107. A p-type super-lattice cladding layer 109 with a total thickness of 0.6 micrometers is provided over the p-type GaN optical guide layer 108. The super-lattice comprises 120 periods of alternating laminations of an n-type GaN layer with a thickness of 2.5 nanometers and an n-type $Al_{0.14}Ga_{0.86}N$ layer with a thickness of 2.5 nanometers. A p-type GaN contact layer 110 with a thickness of 0.05 micrometers is provided over the p-type super-lattice cladding layer 109.

The p-type super-lattice cladding layer 109 has a ridged structure 113 with a stripe-shape top surface having a width of 3 micrometers. The ridged structure 113 is selectively provided over the p-type GaN optical guide layer 108. An $SiO_2$ insulating layer 114 is provided on sloped side faces of the ridged structure 113 and on the top surface of the p-type GaN optical guide layer 108. The $SiO_2$ insulating layer 114 has an opening over the top of the stripe-shape top surface of the ridged structure of the p-type super-lattice cladding layer 109. The p-type GaN contact layer 110 is provided on the top of the ridged structure of the p-type super-lattice cladding layer 109. The $SiO_2$ insulating layer 114 causes a current confinement into the p-type super-lattice cladding layer 109.

The lamination structure of the n-type $In_{0.1}Ga_{0.9}N$ layer 103, the n-type super-lattice cladding layer 104, the n-type GaN optical guide layer 105, the undoped multiple quantum well active layer 106, the p-type $Al_{0.2}Ga_{0.8}N$ layer 107 and the p-type GaN optical guide layer 108 has a step-like side wall 115 which is formed by a selective etching to the lamination structure and a part of an upper region of the n-type GaN contact layer 102. The n-type GaN contact layer 102 has an etched terrace.

A p-electrode 111 extends over the p-type GaN contact layer 110 and the insulating layer 114. An n-electrode 112 is provided on the etched terrace of the n-type GaN contact layer 102. Since the GaN substrate 101 has a high resistivity, the n-electrode 112 is provided in contact with the n-type GaN contact layer 102.

This laser of FIG. 1 emits a laser beam with a wavelength of 393 nanometers, and has an emission threshold current lower than 110 mA of the conventional one. The GaN crystal substrate is lower in crystal defect or dislocation than a sapphire substrate. The low crystal defect or dislocation of the substrate may realize a longer life-time of the laser. A beam shape in a far field of view has an elliptic shape, wherein the emission laser beam has a horizontal radiation angle of 8 degrees in full width at half maximum and a vertical radiation angle of 31 degrees in full width at half maximum. An aspect ratio is an indication of the elliptic shape. The aspect ratio is given by a ratio of the vertical radiation angle to the horizontal radiation angle. The aspect ratio of this laser is about 3.9. This means that the beam shape is a slender elliptic shape.

Another conventional gallium nitride based compound semiconductor laser will be described hereinafter with reference to the drawings. FIG. 2 is a fragmentary cross sectional elevation view of an example of the other conventional gallium nitride based compound semiconductor laser. This laser is disclosed by S. Nakamura et al. in Applied Physics Letters, vol. 39, 2000, pp. L647–L650. The conventional gallium nitride based compound semiconductor laser is formed over a GaN substrate 201 which has a thickness of 150 micrometers. An n-type $Al_{0.05}Ga_{0.95}N$ contact layer 202 with a thickness of 5 micrometers is provided over the GaN substrate 201. An n-type $In_{0.1}Ga_{0.9}N$ layer 203 with a thickness of 0.1 micrometer is provided over the n-type $Al_{0.05}Ga_{0.95}N$ contact layer 202.

An n-type super-lattice cladding layer 204 with a total thickness of 0.9 micrometers is provided over the n-type $Al_{0.05}Ga_{0.09}N$ contact layer 202. The super-lattice comprises 180 periods of alternating laminations of an n-type GaN layer with a thickness of 2.5 nanometers and an n-type $Al_{0.1}Ga_{0.9}N$ layer with a thickness of 2.5 nanometers. An n-type GaN optical guide layer 205 with a thickness of 0.15 micrometer is provided over the n-type super-lattice cladding layer 204. An undoped multiple quantum well active layer 206 is provided over the n-type GaN optical guide layer 205. The multiple quantum well active layer 206 comprises 3 periods of alternating laminations of an undoped $In_{0.05}Ga_{0.85}N$ quantum well layer with a thickness of 4 nanometers and an undoped $In_{0.02}Ga_{0.98}N$ barrier layer with a thickness of 10 nanometers.

A p-type $Al_{0.35}Ga_{0.65}N$ layer 207 with a thickness of 10 nanometers is provided over the undoped multiple quantum well active layer 206. A p-type GaN optical guide layer 208 with a thickness of 0.15 micrometer is provided over the p-type $Al_{0.35}Ga_{0.65}N$ layer 207. A p-type super-lattice cladding layer 209 with a total thickness of 0.6 micrometers is provided over the p-type GaN optical guide layer 107. The super-lattice comprises 120 periods of alternating laminations of an n-type GaN layer with a thickness of 2.5 nanometers and an n-type $Al_{0.1}Ga_{0.9}N$ layer with a thickness of 2.5 nanometers. A p-type GaN contact layer 210 with a thickness of 15 nanometers is provided over the p-type super-lattice cladding layer 209.

The p-type super-lattice cladding layer 209 has a ridged structure 213 with a stripe-shape top surface having a width of 1.8 micrometers. The ridged structure 213 is selectively provided over the p-type GaN optical guide layer 208. An $SiO_2$ insulating layer 214 is provided on sloped side faces of the ridged structure 213 and on the top surface of the p-type GaN optical guide layer 208. The $SiO_2$ insulating layer 214 has an opening over the top of the stripe-shape top surface of the ridged structure of the p-type super-lattice cladding layer 209. The p-type GaN contact layer 210 is provided on the top of the ridged structure of the p-type super-lattice cladding layer 209. The $SiO_2$ insulating layer 214 causes a current confinement into the p-type super-lattice cladding layer 209.

The lamination structure of the n-type $In_{0.1}Ga_{0.9}N$ layer 203, the n-type super-lattice cladding layer 204, the n-type GaN optical guide layer 205, the undoped multiple quantum well active layer 206, the p-type $Al_{0.2}Ga_{0.8}N$ layer 207 and the p-type GaN optical guide layer 208 has a step-like side wall 215 which is formed by a selective etching to the lamination structure and a part of an upper region of the n-type GaN contact layer 202. The n-type GaN contact layer 202 has an etched terrace.

A p-electrode 211 extends over the p-type GaN contact layer 210 and the insulating layer 214. An n-electrode 212 is provided on the etched terrace of the n-type GaN contact layer 202. Since the GaN substrate 101 has a high resistivity, the n-electrode 212 is provided in contact with the n-type GaN contact layer 202.

This laser of FIG. 2 emits a laser beam with a wavelength of 405 nanometers, and has an emission threshold current lower than 23 mA of the conventional one. The GaN crystal substrate is lower in crystal defect or dislocation than a sapphire substrate. The low crystal defect or dislocation of the substrate may realize a longer life-time of the laser. A beam shape in a far field of view has an elliptic shape, wherein the emission laser beam has a horizontal radiation angle of 11.2 degrees in full width at half maximum and a vertical radiation angle of 29.9 degrees in full width at half maximum. An aspect ratio is an indication of the elliptic shape. The aspect ratio is given by a ratio of the vertical radiation angle to the horizontal radiation angle. The aspect ratio of this laser is about 2.7, even the width of the stripe-shape top surface of the ridge structure is made narrow at 1.8 micrometers for allowing a relatively wide horizontal radiation angle. The aspect ratio of about 2.7 means that the beam shape is a slender elliptic shape.

The GaN substrate is more advantageous than the sapphire substrate in view of the desired increase in the device life-time.

SUMMARY OF THE INVENTION

Accordingly, it is an object of the present invention to provide a novel gallium nitride based compound semiconductor laser device free from the above problems.

The present invention provides a light-emitting semiconductor device includes an active layer interposed between first-side and second-side cladding layer, and at least one of first-side and second-side optical guide layers. The following four equations are satisfied:

$$0.15 \leq h;$$

$$|x-y| \leq 0.02;$$

$$0.02 \leq x \leq 0.06; \text{ and}$$

$$0.34x - 0.49 \leq d1 + 2h,$$

where "h" is a total thickness of the first-side and second-side optical guide layers; "d1" is a thickness of the first-side cladding layer; "x" is a first Al-index of a first AlGaN bulk crystal which has a first refractive index equal to a first averaged refractive index of the first-side cladding layer; and "y" represents a second Al-index of a second AlGaN bulk crystal which has a second refractive index equal to a second averaged refractive index of the second-side cladding layer.

The above, and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTIONS OF THE PRESENT INVENTION

Figure 1:
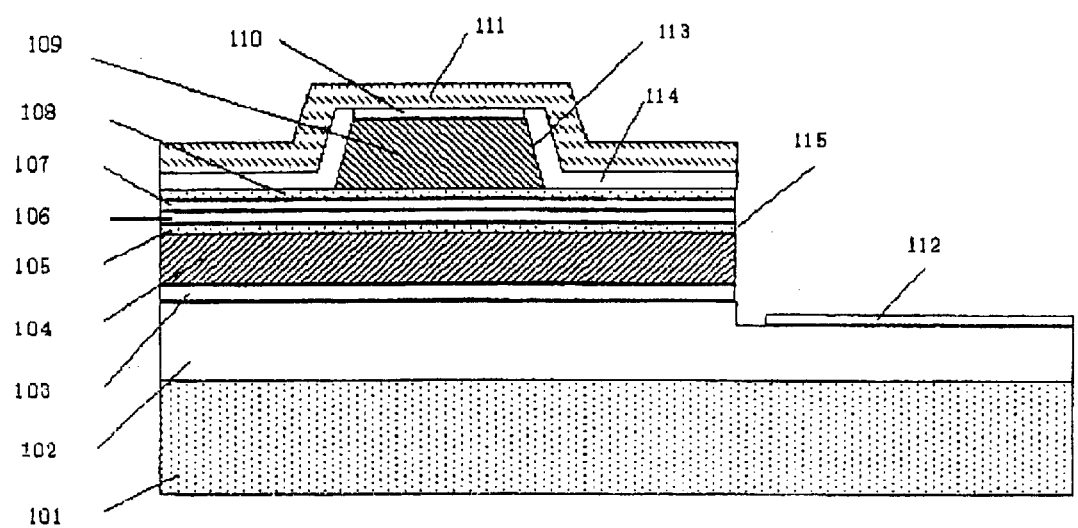
FIG. 1 is a fragmentary cross sectional elevation view of an example of the conventional gallium nitride based compound semiconductor laser.

A first aspect of the present invention is a light-emitting semiconductor device including: a nitride based compound semiconductor multilayer structure which further includes: an active layer; a first-side cladding layer under the active layer; a second-side cladding layer over the active layer; and at least one of a first-side optical guide layer over the first-side cladding layer and under the active layer and a second-side optical guide layer over the active layer and under the second-side cladding layer, wherein the following four equations are satisfied:

$$0.15 \leq h;$$

$$|x-y| \leq 0.02;$$

$$0.02 \leq x \leq 0.06; \text{ and}$$

$$0.34x - 0.49 \leq d1 + 2h,$$

where "h" (micrometers) represents a total thickness of the at least one of the first-side and second-side optical guide layers; "d1" (micrometers) represents a thickness of the first-side cladding layer; "x" represents a first Al-index of a first AlGaN bulk crystal which has a first refractive index equal to a first averaged refractive index of the first-side cladding layer; and "y" represents a second Al-index of a second AlGaN bulk crystal which has a second refractive index equal to a second averaged refractive index of the second-side cladding layer.

It is preferable that the first-side and second-side cladding layers provide, in combination, a generally symmetrical distribution of refractive index in a direction vertical to interfaces of the nitride based compound semiconductor multilayer structure.

It is also preferable that the light-emitting semiconductor device emits a laser beam with a wavelength in a range of 380 nanometers to 420 nanometers.

It is also preferable that the nitride based compound semiconductor multilayer structure extends over a GaN base layer.

It is also preferable that each of the first-side and second-side cladding layers comprises a gallium nitride based compound semiconductor bulk crystal layer. In this case, the gallium nitride based compound semiconductor bulk crystal layer may comprise an AlGaN bulk crystal layer.

It is also preferable that each of the first-side and second-side cladding layers comprises a gallium nitride based compound semiconductor super-lattice layer. In this case, the gallium nitride based compound semiconductor super-lattice layer may comprise multiple periods of alternating laminations of a GaN layer and an AlGaN layer.

It is further preferable that the following additional equation is further satisfied:

$$0.21y - 0.42 \leq d2 + h,$$

where "d2" (micrometers) represents a thickness of the second-side cladding layer.

It is also preferable that the four equations are satisfied at least in the vicinity of a center position of a laser beam intensity distribution in the active layer in a plane view parallel to interfaces of the nitride based compound semiconductor multi-layer structure.

A second aspect of the present invention is a light-emitting semiconductor device including: a nitride based compound semiconductor multilayer structure which further includes: an active layer; a first-side cladding layer under the active layer; a second-side cladding layer over the active layer; and at least one of a first-side optical guide layer over the first-side cladding layer and under the active layer and a second-side optical guide layer over the active layer and under the second-side cladding layer, wherein the following four equations are satisfied:

$$0.15 \leq h;$$

$$|x-y| \leq 0.02;$$

$$0.02 \leq x \leq 0.06; \text{ and}$$

$$0.21y - 0.42 \leq d2 + h,$$

where "h" (micrometers) represents a total thickness of the at least one of the first-side and second-side optical guide layers; "d2" (micrometers) represents a thickness of the second-side cladding layer; "x" represents a first Al-index of a first AlGaN bulk crystal which has a first refractive index equal to a first averaged refractive index of the first-side cladding layer; and "y" represents a second Al-index of a second AlGaN bulk crystal which has a second refractive index equal to a second averaged refractive index of the second-side cladding layer.

It is also preferable that the first-side and second-side cladding layers provide, in combination, a generally symmetrical distribution of refractive index in a direction vertical to interfaces of the nitride based compound semiconductor multilayer structure.

It is also preferable that the light-emitting semiconductor device emits a laser beam with a wavelength in a range of 380 nanometers to 420 nanometers.

It is also preferable that the nitride based compound semiconductor multilayer structure extends over a substrate comprising one selected from the group consisting of GaN and AlGaN.

It is also preferable that each of the first-side and second-side cladding layers comprises a gallium nitride based compound semiconductor bulk crystal layer. In this case, may comprise an AlGaN bulk crystal layer.

It is also preferable that each of the first-side and second-side cladding layers comprises a gallium nitride based compound semiconductor super-lattice layer. In this case, the gallium nitride based compound semiconductor super-lattice layer may comprise multiple periods of alternating laminations of a GaN layer and an AlGaN layer.

It is also preferable that the following additional equation is further satisfied:

$$0.34x-0.49 \leq d1+2h,$$

where "d1" (micrometers) represents a thickness of the first-side cladding layer.

It is also preferable that the four equations are satisfied at least in the vicinity of a center position of a laser beam intensity distribution in the active layer in a plane view parallel to interfaces of the nitride based compound semiconductor multi-layer structure.

A third aspect of the present invention is a light-emitting semiconductor device including: a nitride based compound semiconductor multilayer structure which further includes: an active layer; a first-side cladding layer under the active layer; a second-side cladding layer over the active layer; and at least one of a first-side optical guide layer over the first-side cladding layer and under the active layer and a second-side optical guide layer over the active layer and under the second-side cladding layer, wherein the following four equations are satisfied:

$$0.15 \leq h;$$

$$y-x<0.02;$$

$$0.03 \leq x \leq 0.06; \text{ and}$$

$$0.47x-0.5 \leq d1+4h,$$

where "h" (micrometers) represents a total thickness of the at least one of the first-side and second-side optical guide layers; "d1" (micrometers) represents a thickness of the first-side cladding layer; "x" represents a first Al-index of a first AlGaN bulk crystal which has a first refractive index equal to a first averaged refractive index of the first-side cladding layer; and "y" represents a second Al-index of a second AlGaN bulk crystal which has a second refractive index equal to a second averaged refractive index of the second-side cladding layer.

It is also preferable that the first-side and second-side cladding layers provide, in combination, a generally asymmetrical distribution of refractive index in a direction vertical to interfaces of the nitride based compound semiconductor multilayer structure.

It is also preferable that the light-emitting semiconductor device emits a laser beam with a wavelength in a range of 380 nanometers to 420 nanometers.

It is also preferable that the nitride based compound semiconductor multilayer structure extends over a GaN base layer.

It is also preferable that each of the first-side and second-side cladding layers comprises a gallium nitride based compound semiconductor bulk crystal layer. In this case, the gallium nitride based compound semiconductor bulk crystal layer may comprise an AlGaN bulk crystal layer.

It is also preferable that each of the first-side and second-side cladding layers comprises a gallium nitride based compound semiconductor super-lattice layer. In this case, the gallium nitride based compound semiconductor super-lattice layer may comprise multiple periods of alternating laminations of a GaN layer and an AlGaN layer.

It is also preferable that the following additional equation is further satisfied:

$$0.2y-0.33 \leq d2+0.5h,$$

where "d2" (micrometers) represents a thickness of the second-side cladding layer.

It is also preferable that the four equations are satisfied at least in the vicinity of a center position of a laser beam intensity distribution in the active layer in a plane view parallel to interfaces of the nitride based compound semiconductor multi-layer structure.

A fourth aspect of the present invention is a light-emitting semiconductor device including: a nitride based compound semiconductor multilayer structure which further includes: an active layer; a first-side cladding layer under the active layer; a second-side cladding layer over the active layer; and at least one of a first-side optical guide layer over the first-side cladding layer and under the active layer and a second-side optical guide layer over the active layer and under the second-side cladding layer, wherein the following four equations are satisfied:

$$0.15 \leq h;$$

$$y-x>0.02;$$

$$0.03 \leq x \leq 0.06; \text{ and}$$

$$0.2y-0.33 \leq d2+0.5h,$$

where "h" (micrometers) represents a total thickness of the at least one of the first-side and second-side optical guide layers; "d2" (micrometers) represents a thickness of the second-side cladding layer; "x" represents a first Al-index of a first AlGaN bulk crystal which has a first refractive index equal to a first averaged refractive index of the first-side cladding layer; and "y" represents a second Al-index of a second AlGaN bulk crystal which has a second refractive index equal to a second averaged refractive index of the second-side cladding layer.

It is also preferable that the first-side and second-side cladding layers provide, in combination, a generally asymmetrical distribution of refractive index in a direction vertical to interfaces of the nitride based compound semiconductor multilayer structure.

It is also preferable that the light-emitting semiconductor device emits a laser beam with a wavelength in a range of 380 nanometers to 420 nanometers.

It is also preferable that the nitride based compound semiconductor multilayer structure extends over a substrate comprising one selected from the group consisting of GaN and AlGaN.

It is also preferable that each of the first-side and second-side cladding layers comprises a gallium nitride based compound semiconductor bulk crystal layer. In this case, the gallium nitride based compound semiconductor bulk crystal layer may comprise an AlGaN bulk crystal layer.

It is also preferable that each of the first-side and second-side cladding layers comprises a gallium nitride based compound semiconductor super-lattice layer. In this case, the gallium nitride based compound semiconductor super-lattice layer may comprise multiple periods of alternating laminations of a GaN layer and an AlGaN layer.

It is also preferable that the following additional equation is further satisfied:

$$0.47x-0.5 \leq d1+4h,$$

where "d1" (micrometers) represents a thickness of the first-side cladding layer.

It is also preferable that the four equations are satisfied at least in the vicinity of a center position of a laser beam intensity distribution in the active layer in a plane view parallel to interfaces of the nitride based compound semiconductor multi-layer structure.

A fifth aspect of the present invention is a light-emitting semiconductor device including: a gallium nitride based compound semiconductor base layer; and a nitride based compound semiconductor multilayer structure over the gallium nitride based compound semiconductor base layer. The nitride based compound semiconductor multilayer structure further includes: an active layer; a first-side cladding layer under the active layer; a second-side cladding layer over the active layer; and at least one of a first-side optical guide layer over the first-side cladding layer and under the active layer and a second-side optical guide layer over the active layer and under the second-side cladding layer, wherein a vertical radiation angle of a laser beam emitted from the light-emitting semiconductor device is not more than 20 degrees, and further the following equation is satisfied:

$$\frac{-n_e^2}{n_e} \cdot \frac{4(n_e^2 - n_c^2)}{n_s^2 - n_c^2} \cdot \left[ |f(z_0)|^2 \Big/ \int_{-\infty}^{+\infty} f^*(z)f(z)dz \right] \leq 2 \text{ cm}^{-1} \quad (7)$$

where "$n_s$" represents a refractive index of the gallium nitride based compound semiconductor base layer; "$n_c$" represents an averaged refractive index of the first-side cladding layer; "$n_e$" represents a waveguide mode equivalent refractive index; "z" represents a coordinate axis along a direction vertical to interfaces of the nitride based compound semiconductor multilayer structure, provided a positive direction of the coordinate axis is toward the gallium nitride based compound semiconductor base layer, "f(z)" represents a function in z-coordinate system of a field distribution of laser beam, and "$z_0$" represents a position projected on the z-coordinate axis of a first interface of the first-side cladding layer, provided the first interface is closer to the gallium nitride based compound semiconductor base layer.

It is also preferable that each of the first-side and second-side cladding layers comprises a gallium nitride based compound semiconductor bulk crystal layer. In this case, the gallium nitride based compound semiconductor bulk crystal layer may comprise an AlGaN bulk crystal layer.

It is also preferable that the gallium nitride based compound semiconductor base layer comprises a GaN base layer.

It is also preferable that the equation is satisfied at least in the vicinity of a center position of a laser beam intensity distribution in the active layer in a plane view parallel to interfaces of the nitride based compound semiconductor multi-layer structure.

A sixth aspect of the present invention is a light-emitting semiconductor device including: a gallium nitride based compound semiconductor substrate; a nitride based compound semiconductor multilayer structure over the gallium nitride based compound semiconductor substrate. The nitride based compound semiconductor multilayer structure further includes: an active layer; a first-side cladding layer under the active layer; a second-side cladding layer over the active layer; and at least one of a first-side optical guide layer over the first-side cladding layer and under the active layer and a second-side optical guide layer over the active layer and under the second-side cladding layer; and a second-side electrode closer to the second-side cladding layer than the active layer, wherein a vertical radiation angle of a laser beam emitted from the light-emitting semiconductor device is not more than 20 degrees, and further the following equation is satisfied:

$$3 \cdot \alpha_{metal} \cdot \Gamma_p \leq 5 \text{ cm} \quad (8)$$

where "$\alpha_{metal}$" represents an optical absorption coefficient of the second-side electrode, and "$\Gamma_p$" represents a waveguide mode optical confinement coefficient of the second-side electrode.

It is also preferable that the gallium nitride based compound semiconductor substrate comprises one selected from the group consisting of GaN and AlGaN.

It is also preferable that each of the first-side and second-side cladding layers comprises a gallium nitride based compound semiconductor super-lattice layer. In this case, the gallium nitride based compound semiconductor super-lattice layer may comprise multiple periods of alternating laminations of a GaN layer and an AlGaN layer.

It is also preferable that the equation is satisfied at least in the vicinity of a center position of a laser beam intensity distribution in the active layer in a plane view parallel to interfaces of the nitride based compound semiconductor multi-layer structure.

Approach to the Present Invention:

The present invention has been made by the present inventors by the following technical investigations to improve the gallium nitride based compound semiconductor lasers.

Figure 2:
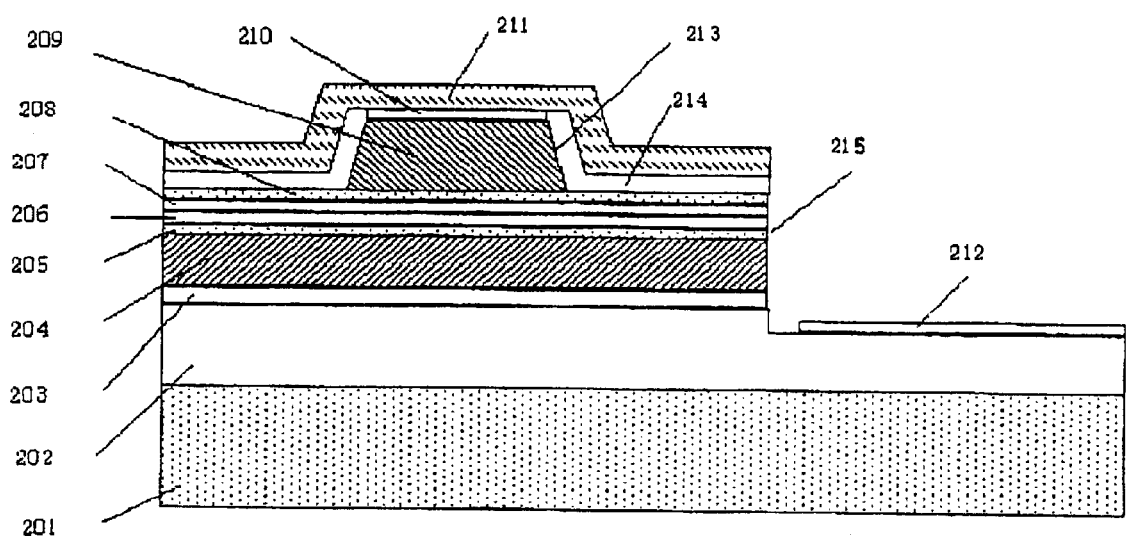
FIG. 2 is a fragmentary cross sectional elevation view of an example of the other conventional gallium nitride based compound semiconductor laser.

The above-described first and second conventional gallium nitride based compound semiconductor lasers shown in FIGS. 1 and 2 have the following disadvantages or issues to be solved by the present invention. As described above, the first conventional gallium nitride based compound semiconductor laser shown in FIG. 1 has a large vertical radiation angle of approximately 30 degrees and a large aspect ratio of approximately 3.9. The second conventional gallium nitride based compound semiconductor laser shown in FIG. 2 also has a large vertical radiation angle of approximately 30 degrees and a large aspect ratio of approximately 2.7.

The spreading laser beam is converted into a parallel laser beam through a collimate lens which is a circle shape. Since, however, each the laser beam has such a large aspect ratio of 3.9 or 2.7, only a minority part of the spreading laser beam is transmitted through the collimate lens and converted into the parallel laser beam. This means that the remaining majority part of the spreading laser beam is not utilized. Namely, the efficiency in utilizing the emitted laser beam is low.

Figure 3:
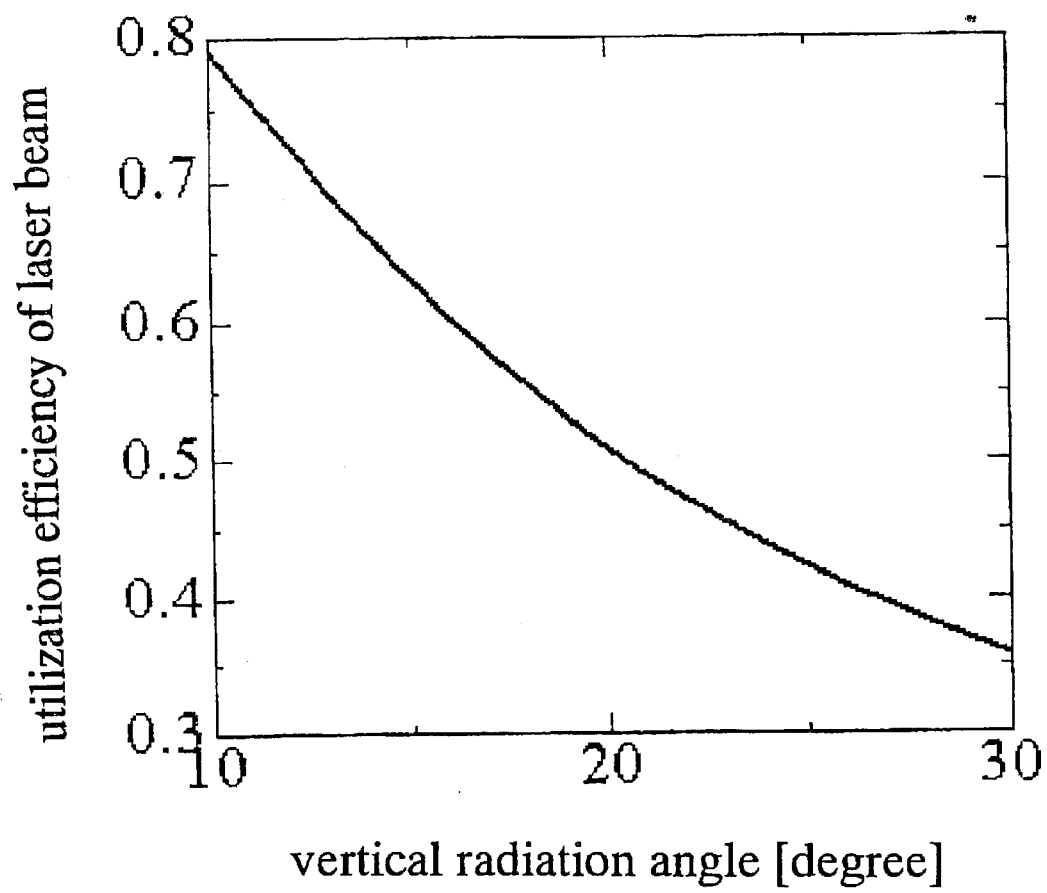
FIG. 3 is a diagram illustrative of variation in utilization efficiency of laser beam over vertical radiation angle at a fixed horizontal radiation angle of 10 degrees and at a full angle of aperture of 15 degrees of a collimate lens.

FIG. 3 is a diagram illustrative of variation in utilization efficiency of laser beam over vertical radiation angle at a fixed horizontal radiation angle of 10 degrees and at a full angle of aperture of 15 degrees of a collimate lens. The increase in the vertical radiation angle with fixing the horizontal radiation angle means the increase in the aspect ratio. FIG. 3 demonstrates that the increase in the vertical radiation angle causes the decrease in the utilization efficiency of laser beam. At the vertical radiation angle of 30 degrees which means the aspect ratio of 3, the utilization efficiency of laser beam is only about 36%.

The above first and second conventional gallium nitride based compound semiconductor lasers are disadvantageous in low utilization efficiency of laser beam. The low utilization efficiency of laser beam disadvantageously makes it necessary to increase a laser power on the recording surface for realizing a desired large recording speed. The increase in the power of the laser needs an increase in the driving current of the laser. The increase in the driving current makes it difficult to realize a desired long life-time.

In order to avoid the above disadvantages with the low utilization efficiency of laser beam, it is possible to convert the elliptic shape of the laser beam into a generally circle shape of the laser beam, by use of an additional optical element such as a prism. The use of such additional optical element may, however, causes the increase in the number of the optical elements, and makes it difficult to reduce the cost of the laser device and to realize a scaling down of the laser device.

Another possible measure to avoid the above disadvantages with the low utilization efficiency of laser beam is to reduce the aspect ratio of the laser beam by increasing the horizontal radiation angle. The increase in the horizontal radiation angle can be realized by decreasing the ridge width. The decrease in width of the ridge structure, however, causes an undesired reduction in hole current confinement width. The device resistance is inversely proportional to the ridge width. The decrease in the ridge width causes the increase in the device resistance, particularly in case of the p-type gallium nitride based semiconductor. The increase in the device resistance causes an undesired increase in driving voltage and also an undesired decrease in modulation band. These are particularly undesired in application to the optical disk.

In view of avoiding the increase in the device resistance, it is undesired to make narrow the ridge width, even the narrow ridge width is effective to increase the horizontal radiation angle for realizing a high utilization efficiency of the laser beam. Therefore, the remaining effective measure to reduce the aspect ratio of the laser beam is to reduce the vertical radiation angle of the laser beam. In FIG. 3, it is demonstrated that the reduction in the vertical radiation angle of the laser beam causes the increase in the utilization efficiency of the laser beam. For example, as the vertical radiation angle is 20 degrees and the aspect ratio is 2, then the utilization efficiency of the laser beam is 51%. As the vertical radiation angle is 15 degrees and the aspect ratio is 1.5, then the utilization efficiency of the laser beam is 63%. As the vertical radiation angle is 10 degrees and the aspect ratio is 1, then the utilization efficiency of the laser beam is 79%.

In order to reduce the vertical radiation angle, it is effective to increase the refractive index of the cladding layer of the laser device for widening an electric field distribution in a layer-thickness direction of the layer device. If the cladding layer comprises AlGaN, then the reduction in averaged compositional index of Al causes the desired increase in the refractive index of the cladding layer of the laser device. In the above described first and second conventional gallium nitride based compound semiconductor lasers, the super-lattice cladding layers have averaged Al-indexes of 0.07 and 0.05 respectively.

Figure 4:
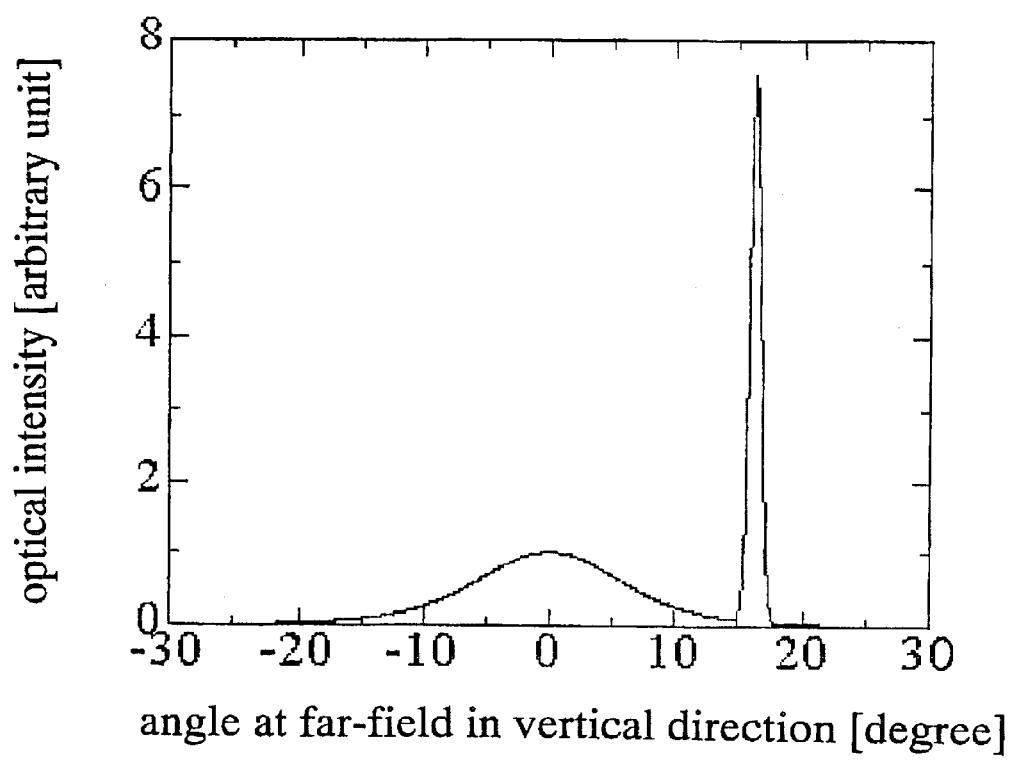
FIG. 4 is a diagram illustrative of variation in optical intensity in arbitrary unit over angle of far-field of view in vertical direction in degree unit.

For investigation on the influence of the averaged Al-index, a comparative gallium nitride based compound semiconductor laser was formed, which has a different structure from that of the first conventional gallium nitride based compound semiconductor laser in view of the p-type and n-type super-lattice cladding layers. The p-type and n-type super-lattice cladding layers of the comparative gallium nitride based compound semiconductor laser have the same thicknesses as those of the first conventional gallium nitride based compound semiconductor laser. The p-type and n-type super-lattice cladding layers of the comparative gallium nitride based compound semiconductor laser are different in the averaged Al-index from those of the first conventional gallium nitride based compound semiconductor laser. The p-type and n-type super-lattice cladding layers of the, comparative gallium nitride based compound semiconductor laser comprise an Al-index-reduced aluminum gallium nitride compound semiconductor bulk, for example, $Al_{0.03}Ga_{0.97}N$ bulk. It was confirmed that this comparative gallium nitride based compound semiconductor laser has an extremely high emission threshold value, and an extremely low slope efficiency which is defined to be a gradient of optical output with reference to injection current. The causes for the above undesired results were investigated, and the following facts were founded. FIG. 4 is a diagram illustrative of variation in optical intensity in arbitrary unit over angle of far-field of view in vertical direction in degree unit. FIG. 4 shows a far-field image in the vertical direction of the comparative gallium nitride based compound semiconductor laser, wherein the optical intensity takes a peak at about 14 degrees of the angle of far-field of view in vertical direction. This demonstrates that a vertical radiation angle in full width at half maximum was about 14 degrees. This comparative gallium nitride based compound semiconductor laser has a vertical radiation angle which is much lower than those of the above-described first and second conventional gallium nitride based compound semiconductor lasers. The image as observed was, however, an extremely intensive spike-like pattern which is undesirable.

The spike-like pattern would be caused by the following facts. The refractive index of GaN for the n-type contact layer and the substrate is larger in a waveguide mode equivalent refractive index which is defined to be an equivalent refractive index when a laser beam is propagated through a waveguide layer which comprises a lamination structure of an active layer, optical guide layers and cladding layers, for which reason a part of the laser beam is permeated into the substrate and the n-type contact layer. This relationship in the refractive index is specific or unique for the gallium nitride based compound semiconductors. This partial permeation of the laser beam into the substrate and the n-type contact layer means a certain radiation loss, which causes the increase in internal loss of the laser beam. The increase in internal loss of the laser beam causes an increase in the threshold value for the laser emission. The increase in the threshold value for the laser emission causes the drop of the slope efficiency.

In addition, the extremely intensive spike-like pattern causes an intensive stray light in optical system such as optical disk system.

As described above, in order to reduce the vertical radiation angle, it is effective to increase the refractive index of the cladding layer, for example, by reducing the averaged Al-index of the aluminum gallium nitride cladding layer. This reduction in the averaged Al-index causes the program with the radiation loss due to undesired permeation of the laser beam into the GaN substrate and the GaN contact layer. In order to suppress the undesired radiation loss, it is effective to increase the thickness of the cladding layer, for example, the n-type cladding layer interposed between the substrate and the active layer, so as to increase respective distances of the GaN substrate and the GaN contact layer from the active layer for reduction in the undesired permeation of the laser beam into the GaN substrate and the GaN contact layer.

Figure 5:
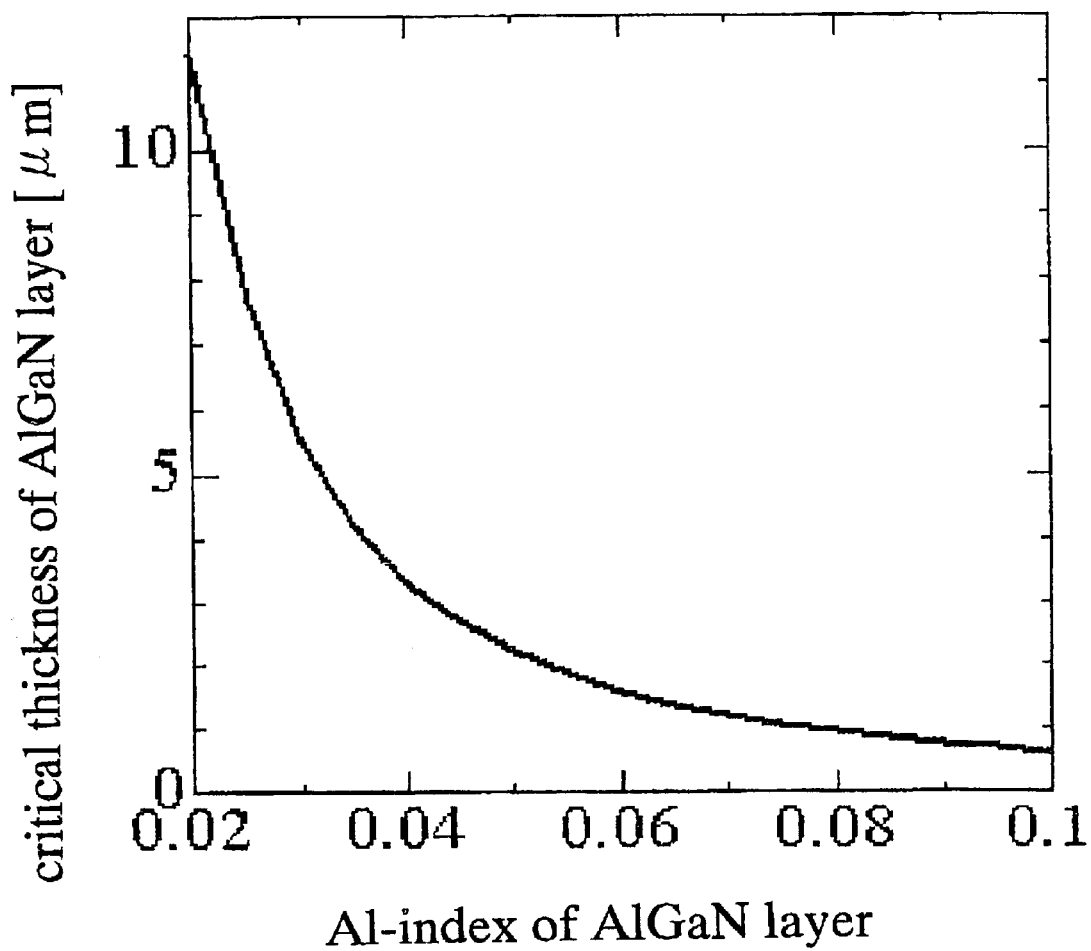
FIG. 5 is a diagram illustrative of experimental results of variation in crack-free critical thickness of AlGaN layer over Al-index of AlGaN layer.

The increase in the thickness of the n-type cladding layer interposed between the substrate and the active layer, however, causes still another problem with increase impossibility of appearance of cracks in the n-type cladding layer. FIG. 5 is a diagram illustrative of experimental results of variation in crack-free critical thickness of AlGaN layer over Al-index of AlGaN layer, wherein the crack-free critical thickness of AlGaN layer means a critical thickness at which any crack appears in the AlGaN layer just after crystal growth FIG. 5 shows that the crack-free critical thickness range over the Al-index of AlGaN layer. The crack is caused by a strain due to a difference in lattice constant between AlGaN and GaN. The increase in Al-index of AlGaN causes the increase in the difference in lattice constant between AlGaN and GaN. The increase in the difference in lattice constant between AlGaN and GaN reduces the crack-free critical thickness of AlGaN layer. During the fabrication processes for the laser device, the strain caused in the crystal growth process may cause new cracks in later processes, for example, heat treatment processes. For this reason, the practically available thickness of the AlGaN layer should be smaller than the critical-thickness shown in FIG. 5.

Accordingly, as described above, the n-type cladding layer has the following programs. The increase in the refractive index of the n-type cladding layer is necessary for reducing the vertical radiation angle, while the suppressions to the radiation loss and to the crack are also necessary. The suppressions to the radiation loss and to the crack are trade-off-relations because the suppression to the radiation loss needs increasing the thickness of the n-type cladding layer, while the suppression to the crack needs decreasing the thickness of the n-type cladding layer.

In the above-described difficult circumstances, it is necessary for the n-type cladding layer to make an accurate estimation on inter-relationships among the radiation loss, the refractive index or averaged Al-index of the n-type cladding layer, and the thickness of the n-type cladding layer.

In addition to the n-type cladding layer, it was also found for the p-type cladding layer that the causes for increasing the emission threshold value and decreasing the slope efficiency are not only the radiation loss but also a "p-electrode loss". The term "p-electrode loss" will, hereby, be defined to be a total loss including both an absorption loss due to an absorption of the laser beam into the p-electrode and a scattering loss due to scattering the laser beam by the p-electrode. The p-electrode comprises a metal which has a relatively large optical absorption coefficient. The p-electrode may have an undesired structural non-uniformity and an undesired surface irregularity, both of which cause scattering of the laser beam at the p-electrode.

In order to reduce the p-electrode loss, it is effective to increase a distance of the p-electrode from the active layer by increasing the thickness of the p-type cladding layer interposed between the active layer and the p-electrode. It should, however, be noted that the gallium nitride based compound semiconductor laser has a specific or unique problem that the p-type cladding layer has a relatively high resistivity, and thus the increase in the thickness of the p-type cladding layer causes the increase of the device resistance. Further, the increase in the thickness of the p-type cladding layer may cause another program with causing undesired crack as described with reference to the n-type cladding layer.

Accordingly, similarly to the n-type cladding layer, the p-type cladding layer has the following programs. The increase in the refractive index of the p-type cladding layer is necessary for reducing the vertical radiation angle, while the suppressions to the p-electrode loss and to the crack and the device resistance are also necessary. The suppressions to the p-electrode loss and to the crack and the device resistance are trade-off-relations because the suppression to the p-electrode loss needs increasing the thickness of the p-type cladding layer, while the suppression to the crack and the device resistance needs decreasing the thickness of the p-type cladding layer.

In the above-described difficult circumstances, it is necessary for the p-type cladding layer to make an accurate estimation on inter-relationships among the p-electrode loss, the refractive index or averaged Al-index of the p-type cladding layer, and the thickness of the p-type cladding layer.

In the above descriptions, the n-side is positioned under the undoped active layer, while the p-side is positioned over the undoped active layer. The above descriptions may be applicable to other example that the p-side is positioned under the undoped active layer, while the n-side is positioned over the undoped active layer. The polarities, for example, n-type and p-type are mere examples. The following descriptions will be made with reference to the term "first-side cladding layer" defined to be a cladding layer positioned under the undoped active layer, and the term "second-side cladding layer" defined to be another cladding layer positioned over the undoped active layer as well as with reference to the term "electrode loss", which is defined to be an electrode positioned over the undoped active layer and a confined current flows through this electrode.

Consequently, in order to increase the utilization efficiency of the laser beam, it is necessary to reduce the aspect ratio of the laser beam. In order to reduce the aspect ratio of the laser beam without reducing the ridge width, it is necessary to reduce the vertical radiation angle. In order to reduce the vertical radiation angle, it is necessary to reduce the refractive index of the cladding layer or reduce the Al-index of the AlGaN cladding layer.

In view of realizing the reduction in the refractive index or the Al-index of the first-side AlGaN cladding layer positioned under the active layer, the first-side cladding layer has the above-described first trade-off relationship between suppression to the crack and suppression to the radiation loss. It is, therefore, necessary for the first-side cladding layer to estimate the first inter-relationship among the radiation loss, the refractive index or the Al-index of the first-side cladding layer, and the crack-free critical thickness.

In view of realizing the reduction in the refractive index or the Al-index of the second-side AlGaN cladding layer over the active layer, the second-side cladding layer has the above-described second trade-off relationship between suppression to the crack and the device resistance and suppression to the electrode loss. It is, therefore, necessary for the second-side cladding layer to estimate the second inter-relationship among the p-electrode loss, the refractive index or the Al-index of the second-side cladding layer, and the crack-free critical thickness.

Suppression to Radiation Loss

The present inventors made the following theoretical investigations on the inter-relationship between the radiation loss and the structure of the gallium nitride based semiconductor laser which includes a substrate of AlGaN or GaN, and lamination structures of a first-side cladding layer, a first-side optical guide layer, an active layer, a second-side optical guide layer and a second-side cladding layer. In the present specification, the term "first-side" means one side under the active layer and over the substrate, while the term "second-side" means an opposite side over the active layer.

The present inventors found out that the radiation loss "$\alpha r$" is given by the following equation (1).

$$\alpha_r = \frac{\sqrt{n_s^2 - n_e^2}}{n_e} \cdot \frac{4(n_e^2 - n_c^2)}{n_s^2 - n_c^2} \cdot \left[ |f(z_0)|^2 \bigg/ \int_{-\infty}^{+\infty} f^*(z)f(z)dz \right] \quad (1)$$

where "$n_s$" represents a refractive index of the substrate, "$n_c$" represents an averaged refractive index of the first-side cladding layer under the active layer, "$n_e$" represents a waveguide mode equivalent refractive index, "z" represents a coordinate axis along layer-thickness direction, provided a positive direction of the coordinate axis is toward the substrate, "f(z)" represents a function in z-coordinate system of a field distribution of laser beam, and "$z_0$" represents a position projected on the z-coordinate axis of a first interface of the first-side cladding layer, provided the first interface faces to the substrate.

In order to confirm the accuracy of the above-identified equation (1), the present inventors proposed a method of estimating the radiation loss from a spike-like pattern in the far-field of view as shown in FIG. 4, so that a calculated value of the radiation loss by use of the above first equation (1) was compared to an estimated value estimated by the method proposed by the present inventors. It is, hereby, defined that a spike-mode radiation pattern intensity integrated value "$I_s$" is an integrated value of intensity of the spike-mode radiation pattern, and a basic waveguide mode radiation pattern intensity integrated value "$I_0$" is another integrated value of intensity of the basic waveguide mode radiation pattern free of the spike-mode radiation pattern. It was found that in the far-field of view, a ratio "Q" of "$I_s$" to "$I_0$" is proportional to the radiation loss "$\alpha r$", and assuming that respective reflectivities of front-side and rear-side facets of the laser diode are equal to each other, the ratio "Q" is given by the following equation (2).

$$Q = \frac{I_s}{I_0} = \frac{\alpha_r \cdot (1-R)}{\alpha_m \cdot 1/2} \quad (2)$$

where "$\alpha m$" represents a mirror loss, and "R" is a reflectivity of the front-side and rear-side facets. The spike-mode radiation pattern intensity integrated value "$I_s$" in the equation (2) is established, provided that the reflection of the radiation laser beam toward the substrate by the rear mirror of the rear facet does not contributes to the spike-mode radiation pattern intensity in the far-field of view. The spike-mode radiation pattern intensity integrated value "$I_s$" is decreased by absorption of the radiation laser beam into the substrate. Notwithstanding, the GaN substrate with a low dislocation density exhibits a low absorption of the radiation laser beam. The present inventors estimated on the radiation loss over a variety of structure of the laser diode with reference to the above equation (2). The estimated values of the radiation loss based on the equation (2) were compared to the calculated values of the radiation loss based on the equation (1). It was confirmed that a difference between the estimated values and the calculated values is small and in the range of about 10%. This result means that the calculated value based on the equation (1) would be reliable sufficiently. By the way, the above-described comparative gallium nitride based compound semiconductor laser has a large radiation loss in the order of 11 cm$^{-1}$.

The waveguide mode equivalent refractive index "$n_e$" appearing in the above equation (1) may be evaluated from the spike mode radiation pattern in the far-field of view as shown in FIG. 4. It is, thereby, defined that an angular difference "θ" is defined in radian unit between a spike-free radiation pattern peak angle and a spike radiation pattern peak angle. The following equation (3) is established.

$$\sin \theta = n_s \cdot \sin \left[ \tan^{-1}(\sqrt{n_s^2 - n_e^2}/n_e) \right] \quad (3)$$

The angular difference "θ" is a measured value. Namely, the waveguide mode equivalent refractive index "$n_e$" may be calculated from the angular difference "θ" and the refractive index of the substrate "$n_s$". The waveguide mode equivalent refractive index "$n_e$" may also be estimated from a distance between cavity mode wavelengths appearing in spectrum of the laser beam, provided that a wavelength dispersion in connection with the refractive index should be taken into account. The above-described evaluation method utilizing the above-equation (3) is more simple and higher accurate.

A laser internal loss exclusive of both the radiation loss and the electrode loss may be estimated in the order of 10 cm$^{-1}$. For this reason, it is necessary to suppress the radiation loss within about 5 cm$^{-1}$. If, however, the spike mode radiation pattern peak intensity in the far-field of view is almost equal to or lower than the peak intensity of the layer beam propagating the waveguide, then the radiation loss should be within about 2 cm$^{-1}$ for avoiding that the spike mode radiation appears as a remarkable stray light in the optical system. In consideration of the above matters, the radiation loss "$\alpha r$" should satisfy the following equation (4).

$$\alpha_r \leq 2 \ cm^{-1} \quad (4)$$

With reference again to the equation (1), the waveguide mode equivalent refractive index "$n_e$" and the laser beam field distribution function "f(z)" would strongly depend upon not only the averaged refractive index "$n_c$" and a thickness "d1" of the first-side cladding layer under the active layer but also an averaged refractive index "$n_{c2}$" of the second-side cladding layer over the active layer, a thickness "h1" of the first-side optical guide layer under the active layer and another thickness "h2" of the second-side optical guide layer over the active layer. Notwithstanding, the waveguide mode equivalent refractive index "$n_e$" and the laser beam field distribution function "f(z)" would weakly depend upon a thickness of the second-side cladding layer over the active layer.

The above descriptions may be applicable to not only the above-typical example using the GaN substrate but also other examples using other substrate, provided a GaN base layer is interposed between the substrate and the first-side cladding layer. In this case, the thickness of the GaN base layer is preferably not less than 3 micrometers and more preferably not less than 10 micrometers.

Suppression to Electrodes Loss:

The present inventors made an experimental investigation on an inter-relationship between the second-side electrode loss and the structure of the gallium nitride based compound semiconductor laser device which includes a substrate and a lamination structure of an active layer, a first-side cladding layer under the active layer, and a second-side cladding layer over the active layer, and optionally a first-side optical guide layer interposed between the first-side cladding layer and the active layer and also optionally a second-side optical guide layer interposed between the second-side cladding layer and the active layer. The present inventors derived the following equation (5) which gives the electrode loss "$\alpha p$".

$$\alpha_p \cong K \cdot \alpha_{metal} \cdot \left[ \int_{-\infty}^{z_p} f^*(z)f(z)dz \bigg/ \int_{-\infty}^{+\infty} f^*(z)f(z)dz \right] = K \cdot \alpha_{metal} \cdot \Gamma_p \quad (5)$$

where "z" represents a coordinate axis along layer-thickness direction, provided a positive direction of the coordinate axis is toward the substrate, "f(z)" represents a function in z-coordinate system of a field distribution of laser beam, and "zp" represents a position projected on the z-coordinate axis of a first interface of the first-side electrode, provided the first interface faces to the substrate, and "αmetal" represents an optical absorption coefficient of the second-side electrode nearest to the active layer, provided that the optical absorption coefficient depends upon a kind of material or metal of the second-side electrode and usually is in the range of about 500,000 cm$^{-1}$ to about 1,000,000 cm$^{-1}$. Further, "Γp" represents a waveguide mode optical confinement coefficient of the laser beam propagating through the second-side electrode having the optical absorption coefficient "αmetal". "K" represents an equivalent increment factor of the optical absorption coefficient of the second-side electrode. The present inventors found out that the equivalent increment factor "K" is a variable factor in the range of 1 to 3 depending on the preparation method or process even the same material or metal is used for the second-side electrode. The formation of the second-side electrode has an important issue of how to reduce the electrode resistance and the contact resistance.

In order to solve the above important issue, it is necessary to set proper conditions for forming the second-side electrode and conducting one or more heat treatments. The present inventors, however, confirmed that taking the proper conditions is generally likely to increase a roughness of the second-side electrode, and thus a large roughness of the second-side electrode makes it difficult to realize a highly accurate estimation of the electrode loss "αp" based on the optical absorption coefficient "αmetal". It may be presumed that a structural imperfection of the second-side electrode causes optical scattering which causes an increase in effective absorption coefficient of the second-side electrode.

The present inventors utilized the above variable parameter "K" and derived the following equation (6) which is useful for realizing a highly accurate estimation of the electrode loss. Assuming that K=3, the laser internal loss exclusive of the radiation loss and the electrode loss may be estimated to be in the order of 10 cm$^{-1}$. For this reason, the electrode loss "αp" should be suppressed within 5 cm$^{-1}$. Namely, the electrode loss "αp" should satisfy the equation (6).

$$\alpha_p \leq 5 \ cm^{-1} \tag{6}$$

The laser beam field distribution function "f(z)" would strongly depend upon not only the averaged refractive index "$n_c$" of the first-side cladding layer under the active layer but also the averaged refractive index "$n_{c2}$" of the second-side cladding layer over the active layer, the thickness "h1" of the first-side optical guide layer under the active layer and the thickness "h2" of the second-side optical guide layer over the active layer. Notwithstanding, the laser beam field distribution function "f(z)" would weakly depend upon the thickness of the second-side cladding layer over the active layer. The above equations (5) and (6) are applicable to any examples using any substrates.

As described above, the present inventors derived the conditions for suppressing the radiation loss and the electrode loss.

Figure 6:
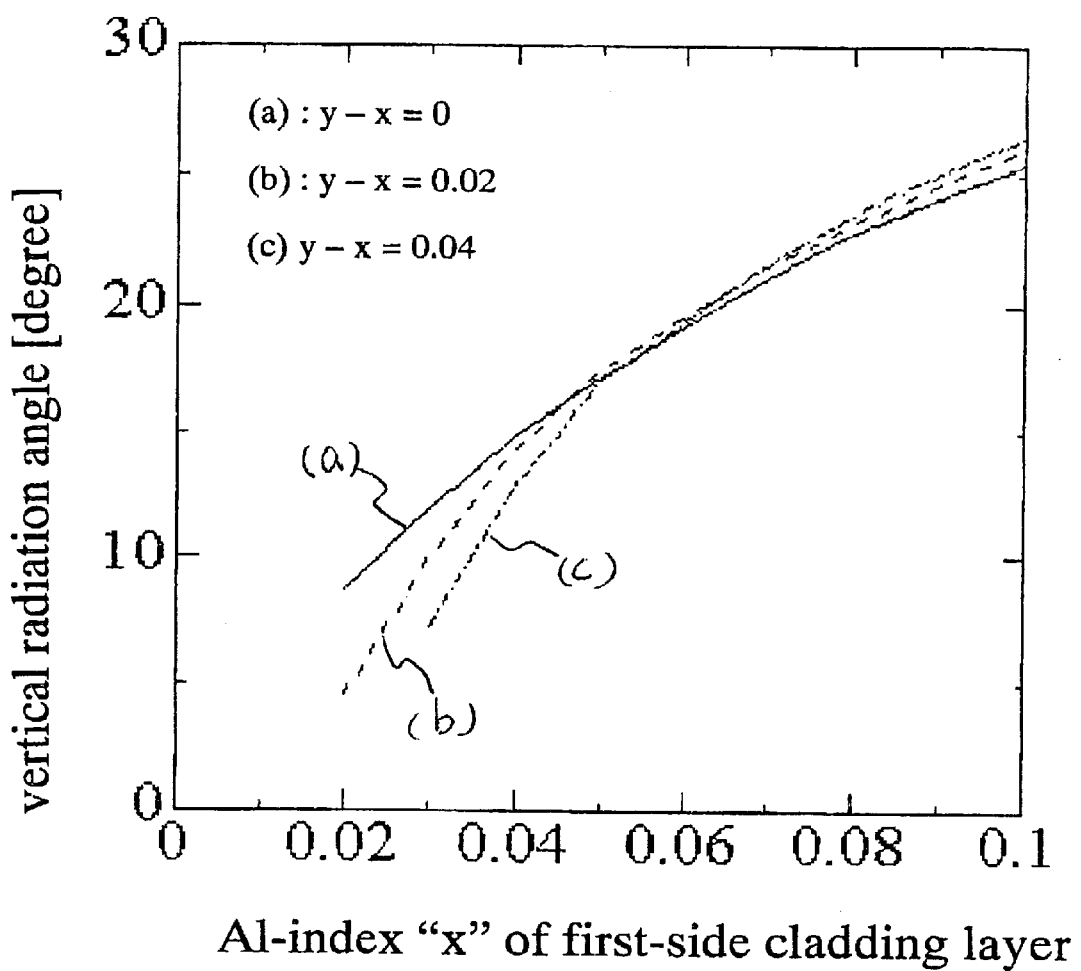
FIG. 6 is a diagram illustrative of variations in vertical radiation angle over Al-index "x" of a first AlGaN bulk being equal in averaged refractive index to the first-side cladding layer.

Reduction of Vertical Radiation Angle:

The descriptions will, hereby focus on the most important issue of how to reduce the vertical radiation angle. FIG. 6 is a diagram illustrative of variations in vertical radiation angle over Al-index "x" of a first AlGaN bulk being equal in averaged refractive index to the first-side cladding layer in cases of various differences between the Al-index "x" of the first AlGaN bulk and another Al-index "y" of a second AlGaN bulk being equal in averaged refractive index to the second-side cladding layer. The real line (a) represents a first case, wherein y−x=0. The broken line (b) represents a second case, wherein y−x=0.02. The dot and broken line (c) represents a third case, wherein y−x=0.04. It was assumed that the first and second optical guide layers comprise GaN, and the respective thicknesses "h1" and "h2" of the first and second optical guide layers are 0.1 micrometer.

Taking into account the above equations (1), (4), (5) and (6), the respective thicknesses of the first-side and second-side cladding layers are sufficiently large so that the radiation loss and the electrode loss are not more than 1 cm$^{-1}$. FIG. 6 shows that in all of the cases, the decrease in the Al-index "x" causes rapid decreases in the vertical radiation angle. If the Al-index "x" is smaller than 0.06, the third case (c) shows a most rapid decrease in the vertical radiation angle by the decrease in the Al-index "x", and the second case (b) shows a next rapid decrease in the vertical radiation angle by the decrease in the Al-index "x", and further the first case (a) shows a slower decrease in the vertical radiation angle by the decrease in the Al-index "x".

Meanwhile, the decrease in the vertical radiation angle means the decease in the optical confinement coefficient of the active layer. The decrease in the vertical radiation angle causes the increase in the threshold value of the laser emission. In FIG. 6, in the first case (a), if the Al-index "x" decreases from 0.02, then the calculated threshold value of the laser emission increases rapidly. In the second case (b), if the Al-index "x" decreases from 0.03, then the calculated threshold value of the laser emission increases rapidly. In the third case (c), if the Al-index "x" decreases from 0.03, then the calculated threshold value of the laser emission increases rapidly.

In the first case (a), if the Al-index "x" satisfies $0.02 \leq x \leq 0.06$, then both reduction in the vertical radiation angle and suppression to the increase in the threshold value of the laser emission would be obtained. In the second case (b), if the Al-index "x" satisfies $0.03 \leq x \leq 0.06$, then both reduction in the vertical radiation angle and suppression to the increase in the threshold value of the laser emission would be obtained. In the third case (c), if the Al-index "x" satisfies $0.03 \leq x \leq 0.06$, then both reduction in the vertical radiation angle and suppression to the increase in the threshold value of the laser emission would be obtained.

In the first case (a), the first-side and second-side cladding layers have a symmetrical structure. In the second and third cases (b) and (c), the first-side and second-side cladding layers have asymmetrical structures. If the Al-index "x" satisfies $0.03 \leq x \leq 0.06$, then such asymmetrical structures allow larger decrease in the vertical radiation angle as compared to the symmetrical structure. The asymmetrical structure is suitable for suppressing the electrode loss even the thickness of the second-side cladding layer is thinner than that in the symmetrical structure. For suppressing the radiation loss, the asymmetrical structure needs a thicker thickness of the first-side cladding layer as compared to the symmetrical structure. In FIG. 6, the total thickness "h1+h2" of the first-side and second-side optical guide layers is 0.2 micrometers. If the total thickness "h1+h2" is smaller than 0.15 micrometers, the optical confinement coefficient of he active layer is too small, and the threshold value of the laser emission is large even the Al-index "x" satisfies the above-preferable condition. As the total thickness "h1+h2" of the first-side and second-side optical guide layers becomes large, then the vertical radiation angle is likely to become large, for which reason an excessively large total thickness "h1+h2" of the first-side and second-side optical guide layers is not preferable. In practice, it is preferable that the total thickness "h1+h2" of the first-side and second-side optical guide layers is in the range of 0.2 micrometers to 0.4 micrometers.

As described above, the present inventors found out the structural condition for suppressing the radiation loss and the structural condition for suppressing the electrode loss, as well as the structural condition for reducing the vertical radiation angle without excessively reducing the optical confinement coefficient of the active layer. In order to realize the desired laser device having a reduced vertical radiation angle and a low threshold value of laser emission as well as having a reduced device resistance, it is necessary to satisfy all of the last-mentioned structural conditions for suppressing the radiation loss and the electrode loss and reducing the vertical radiation angle without excessively reducing the optical confinement coefficient of the active layer.

The present inventors found out the following specific structural conditions in the important wavelength range of 380–420 nanometers.

First Aspect of the Structural Condition in Accordance with the Present Invention:

A first aspect of the present invention is a gallium nitride based compound semiconductor laser device which emits a laser beam with a wavelength in a range of 380 nanometers to 420 nanometers. The gallium nitride based compound semiconductor laser device includes a multilayer structure over a GaN base layer. The multilayer structure includes an active layer, a first-side cladding layer over the GaN base layer and under the active layer, a second-side cladding layer over the active layer, and at least one of a first-side optical guide layer over the first-side cladding layer and under the active layer and a second-side optical guide layer over the active layer and under the second-side cladding layer. The first-side cladding layer and the second-side cladding layer provide, in combination, a generally symmetrical distribution of refractive index in a direction vertical to interfaces of the multilayer structure. The following four equations are satisfied.

$$0.15 \leq h$$

$$|x-y| \leq 0.02;$$

$$0.02 \leq x \leq 0.06; \text{ and}$$

$$0.34x - 0.49 \leq d1 + 2h,$$

where "h" (micrometers) represents a total thickness of at least one of the first-side optical guide layer and the second-side optical guide layer; "d1" (micrometers) represents a thickness of the first-side cladding layer; "x" represents an Al-index of AlGaN bulk crystal which is equal in averaged refractive index to the first-side cladding layer; and "y" represents another Al-index of another AlGaN bulk crystal which is equal in averaged refractive index to the second-side cladding layer.

There is no limitation to the conductivity type of each of the first-side and second-side cladding layers. In one typical example, the first-side cladding layer may be an n-type cladding layer, and the second-side cladding layer may be a p-type cladding layer.

The above first set of the four structural conditions is applicable to the case, wherein the first-side cladding layer and the second-side cladding layer provide, in combination, a generally symmetrical distribution of refractive index in a direction vertical to interfaces of the multilayer structure. For example, the first-side and second-side cladding layers have the same refractive index as each other. The above first set of the four structural conditions provides structural conditions for suppressing the radiation loss and reducing the vertical radiation angle without excessively reducing the optical confinement coefficient of the active layer.

The structural conditions for the multilayer structure over the GaN base layer are that the multilayer structure includes an active layer, a first-side cladding layer over the GaN base layer and under the active layer, a second-side cladding layer over the active layer, and at least one of a first-side optical guide layer over the first-side cladding layer and under the active layer, and a second-side optical guide layer over the active layer and under the second-side cladding layer. The gallium nitride based compound semiconductor laser device emits a laser beam with a wavelength in a range of 380 nanometers to 420 nanometers. The above first set of the four structural conditions is satisfied, where "h" (micrometers) is the total thickness of at least one of the first-side optical guide layer and the second-side optical guide layer; "d1" (micrometers) is the thickness of the first-side cladding layer; "x" is the Al-index of AlGaN bulk crystal which is equal in averaged refractive index to the first-side cladding layer; and "y" is the Al-index of another AlGaN bulk crystal which is equal in averaged refractive index to the second-side cladding layer.

It should be noted that since the important parameters for the first-side and second-side cladding layers are the refractive indexes and the thicknesses, the respective refractive indexes of the first-side and second-side cladding layers are represented by the respective Al-indexes in the AlGaN bulk crystals which are respectively equal in averaged refractive index to the first-side and second-side cladding layers. The first-side and second-side cladding layers may comprise gallium nitride based compound semiconductors, in typical example, AlGaN but not limited thereto. The gallium nitride based compound semiconductors may further include one or more other elements such as In and B. The first-side and second-side cladding layers may comprise bulk structures or super-lattice structures.

The above first condition "$0.15 \leq h$", the second condition "$|x-y| \leq 0.02$" and the third condition "$0.02 \leq x \leq 0.06$" correspond to the conditions for obtaining the reduced vertical radiation angle without excessively reducing the optical confinement coefficient of the active layer.

The above fourth condition "$0.34x - 0.49 \leq d1 + 2h$" corresponds to the condition for obtaining a reduced radiation loss of not more than 2 $cm^{-1}$. The fourth condition for obtaining the reduced radiation loss does not include the thickness of the second-side cladding layer. The fourth condition "$0.34x - 0.49 \leq d1 + 2h$" shows that as the Al-index "x" is small, then this means it necessary that $d1 + 2h$ should be large. The increase in the total thickness of the optical guide layer is highly effective by two times as compared to the increase in the thickness of the first-side cladding layer.

In addition, in order to realize a more preferable laser device which has a reduced radiation loss, a reduced electrode loss, and a reduced vertical radiation angle without excessively reducing the optical confinement coefficient of the active layer, it is preferable that the following fifth condition is satisfied.

$$0.21y - 0.42 \leq d2 + h.$$

where "y" is the Al-index of another AlGaN bulk crystal which is equal in averaged refractive index to the second-side cladding layer; "d2" is the thickness of the second-side cladding layer over the active layer; and "h" is the total thickness of at least one of the first-side optical guide layer and the second-side optical guide layer.

The above fifth condition "$0.21y - 0.42 \leq d2 + h$" corresponds to the condition for obtaining a reduced electrode loss of not more than 5 cm$^{-1}$. The fifth condition for obtaining the reduced electrode loss does not include the thickness of the first-side cladding layer. The fifth condition "$0.21y-0.42 \leq d2+h$" shows that as the Al-index "y" is small, then this means it necessary that d2+h should be large. The increase in the total thickness of the optical guide layer is as effective as the increase in the thickness of the second-side cladding layer.

The radiation loss suppressing condition and the electrode loss suppressing condition include the respective thicknesses of the first-side and second-side cladding layers. The above described conditions show the lower limits of the respective thicknesses of the first-side and second-side cladding layers, but do not show any upper limits thereof. The upper limits of the respective thicknesses of the first-side and second-side cladding layers may be decided in view of avoiding the crack. For example, the upper limit of the thickness of the first-side cladding layer is given by the curved line shown in FIG. 5. More preferably, the total thickness of the first-side and second-side cladding layers is within the upper limit provided by the curved line shown in FIG. 5.

The following supplemental description will focus on the refractive index of the super-lattice structure. An averaged refractive index of the super-lattice cladding layer of the above-described first conventional gallium nitride based compound semiconductor laser shown in FIG. 1 is equal to a refractive index of an $Al_{0.07}Ga_{0.93}N$ balk crystal. Another averaged refractive index of the super-lattice cladding layer of the above-described second conventional gallium nitride based compound semiconductor laser shown in FIG. 2 is equal to a refractive index of an $Al_{0.1}Ga_{0.9}N$ balk crystal.

The super-lattice layer comprises a large number of periods of alternating laminations of compositionally different two thin layers. Even if the two super-lattice layers are compositionally identical with each other, the respective averaged refractive indexes of the two super-lattice layers depend upon respective thicknesses of the alternatively laminating two thin layers. If the respective thicknesses of the alternatively laminating two thin layers are increased, then the averaged refractive index of the super-lattice layer becomes close to the refractive index of the AlGaN bulk crystal having the same Al-index as the averaged Al-index of the super-lattice layer. If the respective thicknesses of the alternatively laminating two thin layers are decreased, then a quantum confinement effect becomes remarkable, whereby the averaged refractive index of the super-lattice layer becomes different from the refractive index of the AlGaN bulk crystal having the same Al-index as the averaged Al-index of the super-lattice layer. The distribution in intensity of the laser beam depends on the averaged refractive index. Even if the two super-lattice layers have a constant averaged composition, then a difference in period of the alternatively laminating two thin layers between the two super-lattice layers causes different distributions in intensity of the laser beams. The difference in the distributions in intensity of the laser beams causes different vertical radiation angles. In accordance with the present invention, the respective refractive indexes of the first-side and second-side cladding layers are represented by the respective Al-indexes in the AlGaN bulk crystals which are respectively equal in averaged refractive index to the first-side and second-side cladding layers. If the cladding layer is the super-lattice cladding layer, then the vertical radiation angle is definitive.

In accordance with this aspect of the present invention, there are defined the structural conditions in the layer-thickness direction vertical to the interfaces of the multi-layer structure but in the vicinity of the center position of the laser beam intensity distribution in a plane view parallel to the interfaces of the multi-layer structure. This aspect of the present invention may be applicable to a variety of structures such as a ridge structure, a buried hetero-structure, an active layer rounded structure and other structures, provided that the active layer has a distinctive difference in equivalent refractive index over positions in the plane view. The buried hetero-structure provides a particularly large difference in equivalent refractive index over positions in the plane view. For this reason, this buried hetero-structure is suitable for realizing a laser beam shape near the perfect circle.

Second Aspect of the Structural Condition in Accordance with the Present Invention:

A second aspect of the present invention is a gallium nitride based compound semiconductor laser device which emits a laser beam with a wavelength in a range of 380 nanometers to 420 nanometers. The gallium nitride based compound semiconductor laser device includes a multilayer structure over a substrate comprising either GaN or AlGaN. The multilayer structure includes an active layer, a first-side cladding layer over the substrate and under the active layer, a second-side cladding layer over the active layer, and at least one of a first-side optical guide layer over the first-side cladding layer and under the active layer and a second-side optical guide layer over the active layer and under the second-side cladding layer. The first-side cladding layer and the second-side cladding layer provide, in combination, a generally symmetrical distribution of refractive index in a direction vertical to interfaces of the multilayer structure. The following four equations are satisfied.

$$0.15 \leq h;$$

$$|x-y| \leq 0.02;$$

$$0.02 \leq x \leq 0.06; \text{ and}$$

$$0.21y-0.42 \leq d2+h,$$

where "h" (micrometers) represents a total thickness of at least one of the first-side optical guide layer and the second-side optical guide layer; "d2" (micrometers) represents a thickness of the second-side cladding layer; "x" represents an Al-index of AlGaN bulk crystal which is equal in averaged refractive index to the first-side cladding layer; and "y" represents another Al-index of another AlGaN bulk crystal which is equal in averaged refractive index to the second-side cladding layer.

There is no limitation to the conductivity type of each of the first-side and second-side cladding layers. In one typical example, the first-side cladding layer may be an n-type cladding layer, and the second-side cladding layer may be a p-type cladding layer.

The above second set of the four structural conditions is applicable to the case, wherein the first-side cladding layer and the second-side cladding layer provide, in combination, a generally symmetrical distribution of refractive index in a direction vertical to interfaces of the multilayer structure. For example, the first-side and second-side cladding layers have the same refractive index as each other. The above second set of the four structural conditions provides structural conditions for suppressing the electrode loss and reducing the vertical radiation angle without excessively reducing the optical confinement coefficient of the active layer.

The structural conditions for the multilayer structure over the substrate are that the multilayer structure includes an active layer, a first-side cladding layer over the substrate and under the active layer, a second-side cladding layer over the active layer, and at least one of a first-side optical guide layer over the first-side cladding layer and under the active layer, and a second-side optical guide layer over the active layer and under the second-side cladding layer. The gallium nitride based compound semiconductor laser device emits a laser beam with a wavelength in a range of 380 nanometers to 420 nanometers. The above second set of the four structural conditions is satisfied, where "h" (micrometers) is the total thickness of at least one of the first-side optical guide layer and the second-side optical guide layer; "d2" (micrometers) is the thickness of the second-side cladding layer; "x" is the Al-index of AlGaN bulk crystal which is equal in averaged refractive index to the first-side cladding layer; and "y" is the Al-index of another AlGaN bulk crystal which is equal in averaged refractive index to the second-side cladding layer.

It should be noted that since the important parameters for the first-side and second-side cladding layers are the refractive indexes and the thicknesses, the respective refractive indexes of the first-side and second-side cladding layers are represented by the respective Al-indexes in the AlGaN bulk crystals which are respectively equal in averaged refractive index to the first-side and second-side cladding layers. The first-side and second-side cladding layers may comprise gallium nitride based compound semiconductors, in typical example, AlGaN but not limited thereto. The gallium nitride based compound semiconductors may further include one or more other elements such as In and B. The first-side and second-side cladding layers may comprise bulk structures or super-lattice structures.

The above first condition "$0.15 \leq h$", the second condition "$|x-y| \leq 0.02$" and the third condition "$0.02 \leq x \leq 0.06$" correspond to the conditions for obtaining the reduced vertical radiation angle without excessively reducing the optical confinement coefficient of the active layer.

The above fourth condition "$0.21y-0.42 \leq d2+h$" corresponds to the condition for obtaining a reduced electrode loss of not more than 5 cm$^{-1}$. The fourth condition for obtaining the reduced electrode loss does not include the thickness of the first-side cladding layer. The fourth condition "$0.21y-0.42 \leq d2+h$" shows that as the Al-index "y" is small, then this means it necessary that d2+h should be large. The increase in the total thickness of the optical guide layer is as effective as the increase in the thickness of the second-side cladding layer.

In addition, in order to realize a more preferable laser device which has a reduced radiation loss, a reduced electrode loss, and a reduced vertical radiation angle without excessively reducing the optical confinement coefficient of the active layer, it is preferable that the following fifth condition is satisfied.

$$0.34x-0.49 \leq d1+2h.$$

where "x" is the Al-index of another AlGaN bulk crystal which is equal in averaged refractive index to the first-side cladding layer; "d1" is the thickness of the first-side cladding layer over the active layer; and "h" is the total thickness of at least one of the first-side optical guide layer and the second-side optical guide layer.

The above fifth condition "$0.34x-0.49 \leq d1+2h$" corresponds to the condition for obtaining a reduced radiation loss of not more than 2 cm$^{-1}$. The fifth condition for obtaining the reduced radiation loss does not include the thickness of the second-side cladding layer. The fifth condition "$0.34x-0.49 \leq d1+2h$" shows that as the Al-index "x" is small, then this means it necessary that d1+2h should be large. The increase in the total thickness of the optical guide layer is highly effective by two times as compared to the increase in the thickness of the first-side cladding layer.

The radiation loss suppressing condition and the electrode loss suppressing condition include the respective thicknesses of the first-side and second-side cladding layers. The above described conditions show the lower limits of the respective thicknesses of the first-side and second-side cladding layers, but do not show any upper limits thereof. The upper limits of the respective thicknesses of the first-side and second-side cladding layers may be decided in view of avoiding the crack. For example, the upper limit of the thickness of the first-side cladding layer is given by the curved line shown in FIG. 5. More preferably, the total thickness of the first-side and second-side cladding layers is within the upper limit provided by the curved line shown in FIG. 5.

The following supplemental description will focus on the refractive index of the super-lattice structure. An averaged refractive index of the super-lattice cladding layer of the above-described first conventional gallium nitride based compound semiconductor laser shown in FIG. 1 is equal to a refractive index of an $Al_{0.07}Ga_{0.93}N$ balk crystal. Another averaged refractive index of the super-lattice cladding layer of the above-described second conventional gallium nitride based compound semiconductor laser shown in FIG. 2 is equal to a refractive index of an $Al_{0.1}Ga_{0.9}N$ balk crystal.

The super-lattice layer comprises a large number of periods of alternating laminations of compositionally different two thin layers. Even if the two super-lattice layers are compositionally identical with each other, the respective averaged refractive indexes of the two super-lattice layers depend upon respective thicknesses of the alternatively laminating two thin layers. If the respective thicknesses of the alternatively laminating two thin layers are increased, then the averaged refractive index of the super-lattice layer becomes close to the refractive index of the AlGaN bulk crystal having the same Al-index as the averaged Al-index of the super-lattice layer. If the respective thicknesses of the alternatively laminating two thin layers are decreased, then a quantum confinement effect becomes remarkable, whereby the averaged refractive index of the super-lattice layer becomes different from the refractive index of the AlGaN bulk crystal having the same Al-index as the averaged Al-index of the super-lattice layer. The distribution in intensity of the laser beam depends on the averaged refractive index. Even if the two super-lattice layers have a constant averaged composition, then a difference in period of the alternatively laminating two thin layers between the two super-lattice layers causes different distributions in intensity of the laser beams. The difference in the distributions in intensity of the laser beams causes different vertical radiation angles. In accordance with the present invention, the respective refractive indexes of the first-side and second-side cladding layers are represented by the respective Al-indexes in the AlGaN bulk crystals which are respectively equal in averaged refractive index to the first-side and second-side cladding layers. If the cladding layer is the super-lattice cladding layer, then the vertical radiation angle is definitive.

In accordance with this aspect of the present invention, there are defined the structural conditions in the layer-thickness direction vertical to the interfaces of the multi-layer structure but in the vicinity of the center position of the laser beam intensity distribution in a plane view parallel to the interfaces of the multi-layer structure. This aspect of the present invention may be applicable to a variety of structures such as a ridge structure, a buried hetero-structure, an active layer rounded structure and other structures, provided that the active layer has a distinctive difference in equivalent refractive index over positions in the plane view. The buried hetero-structure provides a particularly large difference in equivalent refractive index over positions in the plane view. For this reason, this buried hetero-structure is suitable for realizing a laser beam shape near the perfect circle.

Third Aspect of the Structural Condition in Accordance with the Present Invention:

A third aspect of the present invention is a gallium nitride based compound semiconductor laser device which emits a laser beam with a wavelength in a range of 380 nanometers to 420 nanometers. The gallium nitride based compound semiconductor laser device includes a multilayer structure over a GaN base layer. The multilayer structure includes an active layer, a first-side cladding layer over the GaN base layer and under the active layer, a second-side cladding layer over the active layer, and at least one of a first-side optical guide layer over the first-side cladding layer and under the active layer and a second-side optical guide layer over the active layer and under the second-side cladding layer. The first-side cladding layer and the second-side cladding layer provide, in combination, a generally asymmetrical distribution of refractive index in a direction vertical to interfaces of the multilayer structure. The following four equations are satisfied.

$$0.15 \leq h;$$

$$y-x > 0.02;$$

$$0.03 \leq x \leq 0.06; \text{ and}$$

$$0.47x - 0.5 \leq d1 + 4h,$$

where "h" (micrometers) represents a total thickness of at least one of the first-side optical guide layer and the second-side optical guide layer; "d1" (micrometers) represents a thickness of the first-side cladding layer; "x" represents an Al-index of AlGaN bulk crystal which is equal in averaged refractive index to the first-side cladding layer; and "y" represents another Al-index of another AlGaN bulk crystal which is equal in averaged refractive index to the second-side cladding layer.

There is no limitation to the conductivity type of each of the first-side and second-side cladding layers. In one typical example, the first-side cladding layer may be an n-type cladding layer, and the second-side cladding layer may be a p-type cladding layer.

The above third set of the four structural conditions is applicable to the case, wherein the first-side cladding layer and the second-side cladding layer provide, in combination, a generally asymmetrical distribution of refractive index in a direction vertical to interfaces of the multilayer structure. For example, the second-side cladding layer is smaller in refractive index than the first-side cladding layer. The asymmetry in the refractive index distribution of the first-side and second-side cladding layers makes it more easy to reduce the vertical radiation angle in a region, where the refractive index of the first-side cladding layer is relatively small, as compared to the above-described symmetrical distribution of refractive index. The asymmetry in the refractive index distribution of the first-side and second-side cladding layers makes it possible to reduce or suppress the electrode loss even the second-side cladding layer is thin. The asymmetry in the refractive index distribution of the first-side and second-side cladding layers, however, causes the increase in the thickness of the first-side cladding layer for suppressing the radiation loss.

The above third set of the four structural conditions provides structural conditions for suppressing the radiation loss and reducing the vertical radiation angle without excessively reducing the optical confinement coefficient of the active layer.

The structural conditions for the multilayer structure over the GaN base layer are that the multilayer structure includes an active layer, a first-side cladding layer over the GaN base layer and under the active layer, a second-side cladding layer over the active layer, and at least one of a first-side optical guide layer over the first-side cladding layer and under the active layer, and a second-side optical guide layer over the active layer and under the second-side cladding layer. The gallium nitride based compound semiconductor laser device emits a laser beam with a wavelength in a range of 380 nanometers to 420 nanometers. The above third set of the four structural conditions is satisfied, where "h" (micrometers) is the total thickness of at least one of the first-side optical guide layer and the second-side optical guide layer; "d1" (micrometers) is the thickness of the first-side cladding layer; "x" is the Al-index of AlGaN bulk crystal which is equal in averaged refractive index to the first-side cladding layer; and "y" is the Al-index of another AlGaN bulk crystal which is equal in averaged refractive index to the second-side cladding layer.

It should be noted that since the important parameters for the first-side and second-side cladding layers are the refractive indexes and the thicknesses, the respective refractive indexes of the first-side and second-side cladding layers are represented by the respective Al-indexes in the AlGaN bulk crystals which are respectively equal in averaged refractive index to the first-side and second-side cladding layers. The first-side and second-side cladding layers may comprise gallium nitride based compound semiconductors, in typical example, AlGaN but not limited thereto. The gallium nitride based compound semiconductors may further include one or more other elements such as In and B. The first-side and second-side cladding layers may comprise bulk structures or super-lattice structures.

The above first condition "$0.15 \leq h$", the second condition "$y-x > 0.02$" and the third condition "$0.03 \leq x \leq 0.06$" correspond to the conditions for obtaining the reduced vertical radiation angle without excessively reducing the optical confinement coefficient of the active layer.

The above fourth condition "$0.47x - 0.5 \leq d1 + 4h$" corresponds to the condition for obtaining a reduced radiation loss of not more than 2 cm$^{-1}$. The fourth condition for obtaining the reduced radiation loss does not include the thickness of the second-side cladding layer. The fourth condition "$0.47x - 0.5 \leq d1 + 4h$" shows that as the Al-index "x" is small, then this means it necessary that $d1+4h$ should be large. The increase in the total thickness of the optical guide layer is highly effective by four times as compared to the increase in the thickness of the first-side cladding layer.

In addition, in order to realize a more preferable laser device which has a reduced radiation loss, a reduced electrode loss, and a reduced vertical radiation angle without excessively reducing the optical confinement coefficient of the active layer, it is preferable that the following fifth condition is satisfied.

$$0.2y - 0.33 \leq d2 + 0.5h.$$

where "y" is the Al-index of another AlGaN bulk crystal which is equal in averaged refractive index to the second-side cladding layer; "d2" is the thickness of the second-side cladding layer over the active layer; and "h" is the total thickness of at least one of the first-side optical guide layer and the second-side optical guide layer.

The above fifth condition "0.2y−0.33≦d2+0.5h" corresponds to the condition for obtaining a reduced electrode loss of not more than 5 cm$^{-1}$. The fifth condition for obtaining the reduced electrode loss does not include the thickness of the first-side cladding layer. The fifth condition "0.2y−0.33≦d2+0.5h" shows that as the Al-index "y" is small, then this means it necessary that d2+0.5h should be large. The increase in the total thickness of the optical guide layer is as effective as one half of the increase in the thickness of the second-side cladding layer.

The radiation loss suppressing condition and the electrode loss suppressing condition include the respective thicknesses of the first-side and second-side cladding layers. The above described conditions show the lower limits of the respective thicknesses of the first-side and second-side cladding layers, but do not show any upper limits thereof. The upper limits of the respective thicknesses of the first-side and second-side cladding layers may be decided in view of avoiding the crack. For example, the upper limit of the thickness of the first-side cladding layer is given by the curved line shown in FIG. 5. More preferably, the total thickness of the first-side and second-side cladding layers is within the upper limit provided by the curved line shown in FIG. 5.

The following supplemental description will focus on the refractive index of the super-lattice structure. An averaged refractive index of the super-lattice cladding layer of the above-described first conventional gallium nitride based compound semiconductor laser shown in FIG. 1 is equal to a refractive index of an $Al_{0.07}Ga_{0.93}N$ balk crystal. Another averaged refractive index of the super-lattice cladding layer of the above-described second conventional gallium nitride based compound semiconductor laser shown in FIG. 2 is equal to a refractive index of an $Al_{0.1}Ga_{0.9}N$ balk crystal.

The super-lattice layer comprises a large number of periods of alternating laminations of compositionally different two thin layers. Even if the two super-lattice layers are compositionally identical with each other, the respective averaged refractive indexes of the two super-lattice layers depend upon respective thicknesses of the alternatively laminating two thin layers. If the respective thicknesses of the alternatively laminating two thin layers are increased, then the averaged refractive index of the super-lattice layer becomes close to the refractive index of the AlGaN bulk crystal having the same Al-index as the averaged Al-index of the super-lattice layer. If the respective thicknesses of the alternatively laminating two thin layers are decreased, then a quantum confinement effect becomes remarkable, whereby the averaged refractive index of the super-lattice layer becomes different from the refractive index of the AlGaN bulk crystal having the same Al-index as the averaged Al-index of the super-lattice layer. The distribution in intensity of the laser beam depends on the averaged refractive index. Even if the two super-lattice layers have a constant averaged composition, then a difference in period of the alternatively laminating two thin layers between the two super-lattice layers causes different distributions in intensity of the laser beams. The difference in the distributions in intensity of the laser beams causes different vertical radiation angles. In accordance with the present invention, the respective refractive indexes of the first-side and second-side cladding layers are represented by the respective Al-indexes in the AlGaN bulk crystals which are respectively equal in averaged refractive index to the first-side and second-side cladding layers. If the cladding layer is the super-lattice cladding layer, then the vertical radiation angle is definitive.

In accordance with this aspect of the present invention, there are defined the structural conditions in the layer-thickness direction vertical to the interfaces of the multi-layer structure but in the vicinity of the center position of the laser beam intensity distribution in a plane view parallel to the interfaces of the multi-layer structure. This aspect of the present invention may be applicable to a variety of structures such as a ridge structure, a buried hetero-structure, an active layer rounded structure and other structures, provided that the active layer has a distinctive difference in equivalent refractive index over positions in the plane view. The buried hetero-structure provides a particularly large difference in equivalent refractive index over positions in the plane view. For this reason, this buried hetero-structure is suitable for realizing a laser beam shape near the perfect circle.

Fourth Aspect of the structural Condition in Accordance with the Present Invention:

A fourth aspect of the present invention is a gallium nitride based compound semiconductor laser device which emits a laser beam with a wavelength in a range of 380 nanometers to 420 nanometers. The gallium nitride based compound semiconductor laser device includes a multilayer structure over a substrate comprising either GaN or AlGaN. The multilayer structure includes an active layer, a first-side cladding layer over the substrate and under the active layer, a second-side cladding layer over the active layer, and at least one of a first-side optical guide layer over the first-side cladding layer and under the active layer and a second-side optical guide layer over the active layer and under the second-side cladding layer. The first-side cladding layer and the second-side cladding layer provide, in combination, a generally asymmetrical distribution of refractive index in a direction vertical to interfaces of the multilayer structure. The following four equations are satisfied.

$$0.15 \leq h;$$

$$y-x>0.02;$$

$$0.03 \leq x \leq 0.06; \text{ and}$$

$$0.2y-0.33 \leq d2+0.5h,$$

where "h" (micrometers) represents a total thickness of at least one of the first-side optical guide layer and the second-side optical guide layer; "d2" (micrometers) represents a thickness of the second-side cladding layer; "x" represents an Al-index of AlGaN bulk crystal which is equal in averaged refractive index to the first-side cladding layer; and "y" represents another Al-index of another AlGaN bulk crystal which is equal in averaged refractive index to the second-side cladding layer.

There is no limitation to the conductivity type of each of the first-side and second-side cladding layers. In one typical example, the first-side cladding layer may be an n-type cladding layer, and the second-side cladding layer may be a p-type cladding layer.

The above fourth set of the four structural conditions is applicable to the case, wherein the first-side cladding layer and the second-side cladding layer provide, in combination, a generally asymmetrical distribution of refractive index in a direction vertical to interfaces of the multilayer structure. For example, the second-side cladding layer is smaller in refractive index than the first-side cladding layer. The asymmetry in the refractive index distribution of the first-side and second-side cladding layers makes it more easy to reduce the vertical radiation angle in a region, where the refractive index of the first-side cladding layer is relatively small, as compared to the above-described symmetrical distribution of refractive index. The asymmetry in the refractive index distribution of the first-side and second-side cladding layers makes it possible to reduce or suppress the electrode loss even the second-side cladding layer is thin. The asymmetry in the refractive index distribution of the first-side and second-side cladding layers, however, causes the increase in the thickness of the first-side cladding layer for suppressing the radiation loss.

The above fourth set of the four structural conditions provides structural conditions for suppressing the electrode loss and reducing the vertical radiation angle without excessively reducing the optical confinement coefficient of the active layer.

The structural conditions for the multilayer structure over the substrate are that the multilayer structure includes an active layer, a first-side cladding layer over the substrate and under the active layer, a second-side cladding layer over the active layer, and at least one of a first-side optical guide layer over the first-side cladding layer and under the active layer, and a second-side optical guide layer over the active layer and under the second-side cladding layer. The gallium nitride based compound semiconductor laser device emits a laser beam with a wavelength in a range of 380 nanometers to 420 nanometers. The above fourth set of the four structural conditions is satisfied, where "h" (micrometers) is the total thickness of at least one of the first-side optical guide layer and the second-side optical guide layer; "d2" (micrometers) is the thickness of the second-side cladding layer; "x" is the Al-index of AlGaN bulk crystal which is equal in averaged refractive index to the first-side cladding layer; and "y" is the Al-index of another AlGaN bulk crystal which is equal in averaged refractive index to the second-side cladding layer.

It should be noted that since the important parameters for the first-side and second-side cladding layers are the refractive indexes and the thicknesses, the respective refractive indexes of the first-side and second-side cladding layers are represented by the respective Al-indexes in the AlGaN bulk crystals which are respectively equal in averaged refractive index to the first-side and second-side cladding layers. The first-side and second-side cladding layers may comprise gallium nitride based compound semiconductors, in typical example, AlGaN but not limited thereto. The gallium nitride based compound semiconductors may further include one or more other elements such as In and B. The first-side and second-side cladding layers may comprise bulk structures or super-lattice structures.

The above first condition "$0.15 \leq h$", the second condition "$y-x>0.02$" and the third condition "$0.03 \leq x \leq 0.06$" correspond to the conditions for obtaining the reduced vertical radiation angle without excessively reducing the optical confinement coefficient of the active layer.

The above fourth condition "$0.2y-0.33 \leq d2+0.5h$" corresponds to the condition for obtaining a reduced electrode loss of not more than 5 $cm^{-1}$. The fourth condition for obtaining the reduced electrode loss does not include the thickness of the first-side cladding layer. The fourth condition "$0.2y-0.33 \leq d2+0.5h$" shows that as the Al-index "y" is small, then this means it necessary that d2+0.5h should be large. The increase in the total thickness of the optical guide layer is as effective as one half of the increase in the thickness of the second-side cladding layer.

In addition, in order to realize a more preferable laser device which has a reduced radiation loss, a reduced electrode loss, and a reduced vertical radiation angle without excessively reducing the optical confinement coefficient of the active layer, it is preferable that the following fifth condition is satisfied.

$$0.47x-0.5 \leq d1+4h.$$

where "x" is the Al-index of another AlGaN bulk crystal which is equal in averaged refractive index to the first-side cladding layer; "d1" is the thickness of the first-side cladding layer over the active layer; and "h" is the total thickness of at least one of the first-side optical guide layer and the second-side optical guide layer.

The above fifth condition "$0.47x-0.5 \leq d1+4h$" corresponds to the condition for obtaining a reduced radiation loss of not more than 2 cm-l. The fifth condition for obtaining the reduced radiation loss does not include the thickness of the second-side cladding layer. The fifth condition "$0.47x-0.5 \leq d1+4h$" shows that as the Al-index "x" is small, then this means it necessary that d1+4h should be large. The increase in the total thickness of the optical guide layer is highly effective by four times as compared to the increase in the thickness of the first-side cladding layer.

The radiation loss suppressing condition and the electrode loss suppressing condition include the respective thicknesses of the first-side and second-side cladding layers. The above described conditions show the lower limits of the respective thicknesses of the first-side and second-side cladding layers, but do not show any upper limits thereof. The upper limits of the respective thicknesses of the first-side and second-side cladding layers may be decided in view of avoiding the crack. For example, the upper limit of the thickness of the first-side cladding layer is given by the curved line shown in FIG. 5. More preferably, the total thickness of the first-side and second-side cladding layers is within the upper limit provided by the curved line shown in FIG. 5.

The following supplemental description will focus on the refractive index of the super-lattice structure. An averaged refractive index of the super-lattice cladding layer of the above-described first conventional gallium nitride based compound semiconductor laser shown in FIG. 1 is equal to a refractive index of an $Al_{0.07}Ga_{0.93}N$ balk crystal. Another averaged refractive index of the super-lattice cladding layer of the above-described second conventional gallium nitride based compound semiconductor laser shown in FIG. 2 is equal to a refractive index of an $Al_{0.1}Ga_{0.9}N$ balk crystal.

The super-lattice layer comprises a large number of periods of alternating laminations of compositionally different two thin layers. Even if the two super-lattice layers are compositionally identical with each other, the respective averaged refractive indexes of the two super-lattice layers depend upon respective thicknesses of the alternatively laminating two thin layers. If the respective thicknesses of the alternatively laminating two thin layers are increased, then the averaged refractive index of the super-lattice layer becomes close to the refractive index of the AlGaN bulk crystal having the same Al-index as the averaged Al-index of the super-lattice layer. If the respective thicknesses of the alternatively laminating two thin layers are decreased, then a quantum confinement effect becomes remarkable, whereby the averaged refractive index of the super-lattice layer becomes different from the refractive index of the AlGaN bulk crystal having the same Al-index as the averaged Al-index of the super-lattice layer. The distribution in intensity of the laser beam depends on the averaged refractive index. Even if the two super-lattice layers have a constant averaged composition, then a difference in period of the alternatively laminating two thin layers between the two super-lattice layers causes different distributions in intensity of the laser beams. The difference in the distributions in intensity of the laser beams causes different vertical radiation angles. In accordance with the present invention, the respective refractive indexes of the first-side and second-side cladding layers are represented by the respective Al-indexes in the AlGaN bulk crystals which are respectively equal in averaged refractive index to the first-side and second-side cladding layers. If the cladding layer is the super-lattice cladding layer, then the vertical radiation angle is definitive.

In accordance with this aspect of the present invention, there are defined the structural conditions in the layer-thickness direction vertical to the interfaces of the multi-layer structure but in the vicinity of the center position of the laser beam intensity distribution in a plane view parallel to the interfaces of the multi-layer structure. This aspect of the present invention may be applicable to a variety of structures such as a ridge structure, a buried hetero-structure, an active layer rounded structure and other structures, provided that the active layer has a distinctive difference in equivalent refractive index over positions in the plane view. The buried hetero-structure provides a particularly large difference in equivalent refractive index over positions in the plane view. For this reason, this buried hetero-structure is suitable for realizing a laser beam shape near the perfect circle.

Fifth Aspect of the Structural Condition in Accordance with the Present Invention:

A fifth aspect of the present invention is a gallium nitride based compound semiconductor laser device which emits a laser beam with any wavelength which may be not only in a range of 380 nanometers to 420 nanometers but also out of this range. The gallium nitride based compound semiconductor laser device includes a multilayer structure over a GaN base layer. The multilayer structure includes an active layer, a first-side cladding layer over the GaN base layer and under the active layer, a second-side cladding layer over the active layer, and at least one of a first-side optical guide layer over the first-side cladding layer and under the active layer and a second-side optical guide layer over the active layer and under the second-side cladding layer. A vertical radiation angle of the emitted laser beam is not more than 20 degrees. The following equation (7) is satisfied.

$$\frac{\sqrt{n_s^2 - n_e^2}}{n_e} \cdot \frac{4(n_e^2 - n_c^2)}{n_s^2 - n_c^2} \cdot \left[ |f(z_0)|^2 \Big/ \int_{-\infty}^{+\infty} f^*(z)f(z)dz \right] \leq 2 \text{ cm}^{-1} \quad (7)$$

where "$n_s$" represents a refractive index of the GaN base layer, "$n_c$" represents an averaged refractive index of the first-side cladding layer under the active layer, "$n_e$" represents a waveguide mode equivalent refractive index, "z" represents a coordinate axis along layer-thickness direction, provided a positive direction of the coordinate axis is toward the base layer, "f(z)" represents a function in z-coordinate system of a field distribution of laser beam, and "$z_0$" represents a position projected on the z-coordinate axis of a first interface of the first-side cladding layer, provided the first interface is closer to the base layer.

In this fifth aspect of the present invention, each of the first-side and second-side cladding layers may comprise an AlGaN bulk crystal. Assuming that the vertical radiation angle is not more than 20 degrees, the above equation (7) is derived from the equation (1) under the condition that the radiation loss is not more than 2 cm$^{-1}$. This condition is applicable to not only the laser beam wavelength in the range of 380 nanometers to 420 nanometers but also other wavelengths.

If the vertical radiation angle of the emitted laser beam is not more than 20 degrees, then this makes it possible to realize a required high level laser power on the optical disk for great improvements in bit rate and transfer speed.

The radiation loss suppressing condition and the electrode loss suppressing condition include the respective thicknesses of the first-side and second-side cladding layers. The above described conditions show the lower limits of the respective thicknesses of the first-side and second-side cladding layers, but do not show any upper limits thereof. The upper limits of the respective thicknesses of the first-side and second-side cladding layers may be decided in view of avoiding the crack. For example, the upper limit of the thickness of the first-side cladding layer is given by the curved line shown in FIG. 5. More preferably, the total thickness of the first-side and second-side cladding layers is within the upper limit provided by the curved line shown in FIG. 5.

The following supplemental description will focus on the refractive index of the super-lattice structure. An averaged refractive index of the super-lattice cladding layer of the above-described first conventional gallium nitride based compound semiconductor laser shown in FIG. 1 is equal to a refractive index of an $Al_{0.07}Ga_{0.93}N$ balk crystal. Another averaged refractive index of the super-lattice cladding layer of the above-described second conventional gallium nitride based compound semiconductor laser shown in FIG. 2 is equal to a refractive index of an $Al_{0.1}Ga_{0.9}N$ balk crystal.

The super-lattice layer comprises a large number of periods of alternating laminations of compositionally different two thin layers. Even if the two super-lattice layers are compositionally identical with each other, the respective averaged refractive indexes of the two super-lattice layers depend upon respective thicknesses of the alternatively laminating two thin layers. If the respective thicknesses of the alternatively laminating two thin layers are increased, then the averaged refractive index of the super-lattice layer becomes close to the refractive index of the AlGaN bulk crystal having the same Al-index as the averaged Al-index of the super-lattice layer. If the respective thicknesses of the alternatively laminating two thin layers are decreased, then a quantum confinement effect becomes remarkable, whereby the averaged refractive index of the super-lattice layer becomes different from the refractive index of the AlGaN bulk crystal having the same Al-index as the averaged Al-index of the super-lattice layer. The distribution in intensity of the laser beam depends on the averaged refractive index. Even if the two super-lattice layers have a constant averaged composition, then a difference in period of the alternatively laminating two thin layers between the two super-lattice layers causes different distributions in intensity of the laser beams. The difference in the distributions in intensity of the laser beams causes different vertical radiation angles. In accordance with the present invention, the respective refractive indexes of the first-side and second-side cladding layers are represented by the respective Al-indexes in the AlGaN bulk crystals which are respectively equal in averaged refractive index to the first-side and second-side cladding layers. If the cladding layer is the super-lattice cladding layer, then the vertical radiation angle is definitive.

In accordance with this aspect of the present invention, there are defined the structural conditions in the layer-thickness direction vertical to the interfaces of the multi-layer structure but in the vicinity of the center position of the laser beam intensity distribution in a plane view parallel to the interfaces of the multi-layer structure. This aspect of the present invention may be applicable to a variety of structures such as a ridge structure, a buried hetero-structure, an active layer rounded structure and other structures, provided that the active layer has a distinctive difference in equivalent refractive index over positions in the plane view. The buried hetero-structure provides a particularly large difference in equivalent refractive index over positions in the plane view. For this reason, this buried hetero-structure is suitable for realizing a laser beam shape near the perfect circle.

Sixth Aspect of the Structural Condition in Accordance with the Present Invention:

A sixth aspect of the present invention is a gallium nitride based compound semiconductor laser device which emits a laser beam with any wavelength which may be not only in a range of 380 nanometers to 420 nanometers but also out of this range. The gallium nitride based compound semiconductor laser device includes a multilayer structure over a substrate which comprises either GaN or AlGaN. The multilayer structure includes an active layer, a first-side cladding layer over the substrate and under the active layer, a second-side cladding layer over the active layer, and at least one of a first-side optical guide layer over the first-side cladding layer and under the active layer and a second-side optical guide layer over the active layer and under the second-side cladding layer. A second-side electrode is positioned closer to the second-side cladding layer than the active layer. A vertical radiation angle of the emitted laser beam is not more than 20 degrees. The following equation (8) is satisfied.

$$3 \cdot \alpha_{metal} \Gamma_p \leq 5 \text{ } cm^{-1} \qquad (8)$$

where "$\alpha_{metal}$" represents an optical absorption coefficient of the second-side electrode, and "$\Gamma_p$" represents a waveguide mode optical confinement coefficient of the second-side electrode having the optical absorption coefficient "$\alpha_{metal}$".

In this sixth aspect of the present invention, each of the first-side and second-side cladding layers may comprise a super-lattice structure of alternating laminations of a GaN layer and an AlGaN layer. Assuming that the vertical radiation angle is not more than 20 degrees, the above equation (8) is derived from the equation (5) under the condition that the radiation loss is not more than 5 $cm^{-1}$. This condition is applicable to not only the laser beam wavelength in the range of 380 nanometers to 420 nanometers but also other wavelengths.

If the vertical radiation angle of the emitted laser beam is not more than 20 degrees, then this makes it possible to realize a required high level laser power on the optical disk for great improvements in bit rate and transfer speed.

The radiation loss suppressing condition and the electrode loss suppressing condition include the respective thicknesses of the first-side and second-side cladding layers. The above described conditions show the lower limits of the respective thicknesses of the first-side and second-side cladding layers, but do not show any upper limits thereof. The upper limits of the respective thicknesses of the first-side and second-side cladding layers may be decided in view of avoiding the crack. For example, the upper limit of the thickness of the first-side cladding layer is given by the curved line shown in FIG. 5. More preferably, the total thickness of the first-side and second-side cladding layers is within the upper limit provided by the curved line shown in FIG. 5.

The following supplemental description will focus on the refractive index of the super-lattice structure. An averaged refractive index of the super-lattice cladding layer of the above-described first conventional gallium nitride based compound semiconductor laser shown in FIG. 1 is equal to a refractive index of an $Al_{0.07}Ga_{0.93}N$ balk crystal. Another averaged refractive index of the super-lattice cladding layer of the above-described second conventional gallium nitride based compound semiconductor laser shown in FIG. 2 is equal to a refractive index of an $Al_{0.1}Ga_{0.9}N$ balk crystal.

The super-lattice layer comprises a large number of periods of alternating laminations of compositionally different two thin layers. Even if the two super-lattice layers are compositionally identical with each other, the respective averaged refractive indexes of the two super-lattice layers depend upon respective thicknesses of the alternatively laminating two thin layers. If the respective thicknesses of the alternatively laminating two thin layers are increased, then the averaged refractive index of the super-lattice layer becomes close to the refractive index of the AlGaN bulk crystal having the same Al-index as the averaged Al-index of the super-lattice layer. If the respective thicknesses of the alternatively laminating two thin layers are decreased, then a quantum confinement effect becomes remarkable, whereby the averaged refractive index of the super-lattice layer becomes different from the refractive index of the AlGaN bulk crystal having the same Al-index as the averaged Al-index of the super-lattice layer. The distribution in intensity of the laser beam depends on the averaged refractive index. Even if the two super-lattice layers have a constant averaged composition, then a difference in period of the alternatively laminating two thin layers between the two super-lattice layers causes different distributions in intensity of the laser beams. The difference in the distributions in intensity of the laser beams causes different vertical radiation angles. In accordance with the present invention, the respective refractive indexes of the first-side and second-side cladding layers are represented by the respective Al-indexes in the AlGaN bulk crystals which are respectively equal in averaged refractive index to the first-side and second-side cladding layers. If the cladding layer is the super-lattice cladding layer, then the vertical radiation angle is definitive.

In accordance with this aspect of the present invention, there are defined the structural conditions in the layer-thickness direction vertical to the interfaces of the multi-layer structure but in the vicinity of the center position of the laser beam intensity distribution in a plane view parallel to the interfaces of the multi-layer structure. This aspect of the present invention may be applicable to a variety of structures such as a ridge structure, a buried hetero-structure, an active layer rounded structure and other structures, provided that the active layer has a distinctive difference in equivalent refractive index over positions in the plane view. The buried hetero-structure provides a particularly large difference in equivalent refractive index over positions in the plane view. For this reason, this buried hetero-structure is suitable for realizing a laser beam shape near the perfect circle.

Abstraction of the First to Sixth Aspects of the Present Invention:

In case that the emitted laser beam has a wavelength in the range of 380 nanometers to 420 nanometers and the first-side and second-side cladding layers provide, in combination, a symmetrical distribution in vertical direction to the interfaces of the active layer, if the above-described first set of the four conditions, which are mentioned in the first aspect of the present invention, is satisfied, then the laser device has the desired reduced vertical radiation angle without excessively reducing the optical confinement coefficient of the active layer, and also has the desired suppressed radiation loss of not more than 2 $cm^{-1}$. If the above-described second set of the four conditions, which are mentioned in the second aspect of the present invention, is satisfied, then the laser device has the desired reduced vertical radiation angle without excessively reducing the optical confinement coefficient of the active layer, and also has the desired suppressed electrode loss of not more than 5 $cm^{-1}$. Further, if both the above-described first set of the four conditions and the above-described second set of the four conditions, which are mentioned in the first and second aspects of the present invention, are satisfied, then the laser device has the desired reduced vertical radiation angle without excessively reducing the optical confinement coefficient of the active layer, and also has the desired suppressed radiation loss of not more than 2 $cm^{-1}$ as well as the desired suppressed electrode loss of not more than 5 $cm^{-1}$.

In case that the emitted laser beam has a wavelength in the range of 380 nanometers to 420 nanometers and the first-side and second-side cladding layers provide, in combination, an asymmetrical distribution in vertical direction to the interfaces of the active layer, if the above-described third set of the four conditions, which are mentioned in the third aspect of the present invention, is satisfied, then the laser device has the desired reduced vertical radiation angle without excessively reducing the optical confinement coefficient of the active layer, and also has the desired suppressed radiation loss of not more than 2 $cm^{-1}$. If the above-described fourth set of the four conditions, which are mentioned in the fourth aspect of the present invention, is satisfied, then the laser device has the desired reduced vertical radiation angle without excessively reducing the optical confinement coefficient of the active layer, and also has the desired suppressed electrode loss of not more than 5 $cm^{-1}$. Further, if both the above-described third set of the four conditions and the above-described fourth set of the four conditions, which are mentioned in the third and fourth aspects of the present invention, are satisfied, then the laser device has the desired reduced vertical radiation angle without excessively reducing the optical confinement coefficient of the active layer, and also has the desired suppressed radiation loss of not more than 2 $cm^{-1}$ as well as the desired suppressed electrode loss of not more than 5 $cm^{-1}$.

Consequently, the present invention can reduce the aspect ratio without reducing the ridge width from 2 micrometers. If the laser device has the ridge structure, then the low aspect ratio of about 2 or less can be obtained. If the laser device has the buried hetero-structure, then the low aspect ratio of nearly 1 can be obtained. The first-side cladding layer may have a thickness sufficiently smaller than the crack-free critical thickness shown in FIG. 5, so the first-side cladding layer may be free of any remarkable crack. Accordingly, the present inventors realized the 400 nm-wavelength band gallium nitride based compound semiconductor laser device which has the reduced aspect ratio, and the reduced driving current and device resistance as well as which is free of any remarkable crack.

In another case that the emitted laser beam has a wavelength out of the range of 380 nanometers to 420 nanometers, if the above-described fifth condition, which is mentioned in the fifth aspect of the present invention, is satisfied, then the laser device has the desired reduced vertical radiation angle of not more than 20 degrees, and also has the desired suppressed radiation loss of not more than 2 $cm^{-1}$. If the above-described sixth condition, which is mentioned in the sixth aspect of the present invention, is satisfied, then the laser device has the desired reduced vertical radiation angle of not more than 20 degrees, and also has the desired suppressed electrode loss of not more than 5 $cm^{-1}$. If both the above-described fifth and sixth conditions are satisfied, the laser device has the desired reduced vertical radiation angle of not more than 20 degrees, and also has the desired suppressed radiation loss of not more than 2 $cm^{-1}$ and the desired suppressed electrode loss of not more than 5 $cm^{-1}$.

In the typical example, the substrate comprises the GaN substrate. For suppressing the radiation loss, other substrate may be available, provided that the GaN base layer preferably with a thickness of not less than 3 micrometers is interposed between the substrate and the first-side cladding layer.

Further, in the typical example, the first-side cladding layer comprises the AlGaN bulk crystal. It is also possible that the first-side cladding layer may further include one or more other elements such as In and B in addition to Al, Ga and N. It is also possible that the first-side cladding layer may comprise the super-lattice structure. It is further possible that an InGaN crack-stopper layer with a thin thickness of, for example, about 0.1 micrometer is interposed between the GaN base layer and the first-side cladding layer. The InGaN crack-stopper layer does not provide any remarkable influence to the optical distribution in the first-side and second-side cladding layers.

The following embodiments are typical examples for practicing the foregoing aspects of the present invention. Although the subject matters of the present invention have been described in details, the following additional descriptions in one or more typical preferred embodiments or examples will be made with reference to the drawings for making it easy to understand the typical modes for practicing the foregoing aspects of the present invention.

Figure 7:
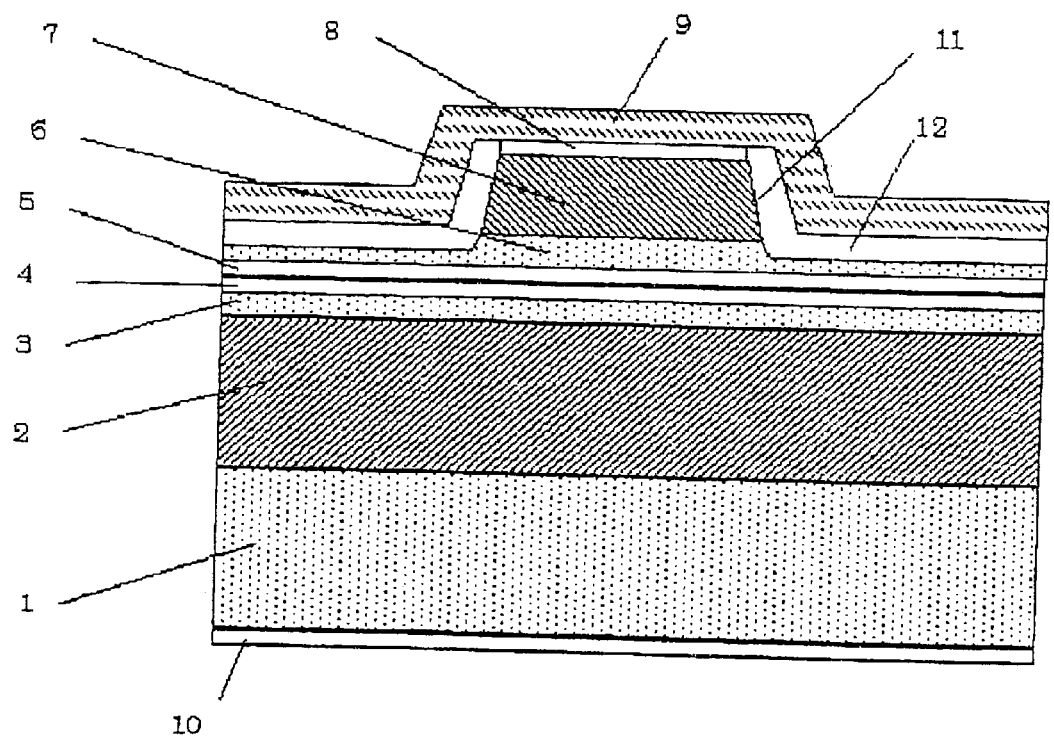
FIG. 7 is a fragmentary cross sectional elevation view of a typical example of the novel gallium nitride based compound semiconductor laser with a ridge structure in accordance with the present invention.

First Embodiment:

A first embodiment according to the present invention will be described in detail with reference to the drawings. FIG. 7 is a fragmentary cross sectional elevation view of a typical example of the novel gallium nitride based compound semiconductor laser with a ridge structure in accordance with the present invention.

The gallium nitride based compound semiconductor laser is formed over an n-type GaN substrate 1 which has a thickness of 100 micrometers. An n-type $Al_{0.05}Ga_{0.95}N$ cladding layer 2 with a thickness of 1.3 micrometers is provided over the n-type GaN substrate 1. An n-type GaN optical guide layer 3 with a thickness of 0.1 micrometer is provided over the n-type $Al_{0.05}Ga_{0.95}N$ cladding layer 2. An undoped multiple quantum well active layer 4 is provided over the n-type GaN optical guide layer 3. The multiple quantum well active layer 4 comprises 3 periods of alternating laminations of an undoped $In_{0.15}Ga_{0.85}N$ quantum well layer with a thickness of 3 nanometers and an undoped $In_{0.02}Ga_{0.98}N$ barrier layer with a thickness of 5 nanometers.

A p-type $Al_{0.2}Ga_{0.8}N$ layer 5 with a thickness of 10 nanometers is provided over the undoped multiple quantum well active layer 4. A p-type GaN optical guide layer 6 with a thickness of 0.1 micrometer is provided over the p-type $Al_{0.2}Ga_{0.9}N$ layer 5. A p-type $Al_{0.5}Ga_{0.95}N$ cladding layer 7 with a thickness of 0.75 micrometers is provided over the p-type GaN optical guide layer 6. A p-type GaN contact layer 8 with a thickness of 15 nanometers is provided over the p-type $Al_{0.05}Ga_{0.95}N$ cladding layer 7.

A part of the p-type GaN optical guide layer 6, the p-type $Al_{0.05}Ga_{0.95}N$ cladding layer 7 and the p-type GaN contact layer 8 form a ridged structure 11 with a stripe-shape top surface having a width of 2 micrometers. An $SiO_2$ insulating layer 12 is provided on sloped side faces of the ridged structure 11 and on the surface of the p-type GaN optical guide layer 6. The SiO$_2$ insulating layer 12 has an opening over the top of the stripe-shape top surface of the ridged structure 11. The SiO$_2$ insulating layer 12 causes a current confinement into the p-type cladding layer 7.

A p-electrode 9 extends over the p-type GaN contact layer 8 and the insulating layer 12. An n-electrode 10 is provided on the bottom surface of the n-type GaN substrate 1.

The above structure satisfies the following five equations or conditions.

$0.15 \leq h$;

$|x-y| \leq 0.02$;

$0.02 \leq x \leq 0.06$;

$0.34x-0.49 \leq d1+2h$; and $0.21y-0.42 \leq d2+h$, where "h1" (micrometers) represents a thickness of the optical guide layer 3; "h2" (micrometers) represents a thickness of the optical guide layer 6 under the ridge structure 11; "d1" (micrometers) represents a thickness of the n-type cladding layer 2; "d2" (micrometers) represents a thickness of the p-type cladding layer 7; "x" represents an Al-index of the n-type cladding layer 2; and "y" represents an Al-index of the p-type cladding layer 7.

It was confirmed that the laser device emits a laser beam with a wavelength of 402 nanometers, and the device has a low emission threshold current of 22 mA.

Figure 8:
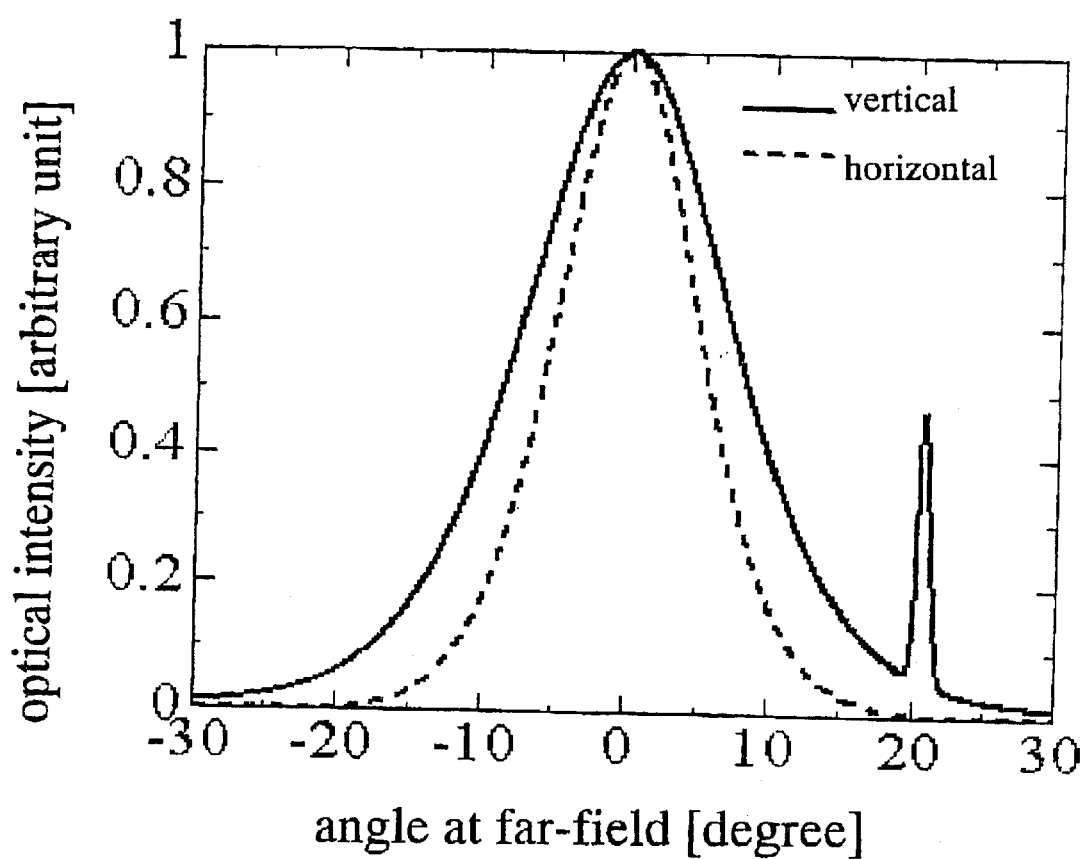
FIG. 8 is a diagram illustrative of variation in optical intensity in arbitrary unit of the laser beam emitted from the laser device over angle of far-field of view in both vertical and horizontal directions in degree unit.

FIG. 8 is a diagram illustrative of variation in optical intensity in arbitrary unit of the laser beam emitted from the laser device over angle of far-field of view in both vertical and horizontal directions in degree unit. Real line represents the laser beam image at far-field of view in the vertical direction to the interfaces of the active layer. Broken line represents the laser beam image at far-field of view in the horizontal direction to the interfaces of the active layer.

It was also confirmed that the laser beam image at far-field of view is an elliptically shaped beam, wherein a horizontal direction radiation angle in full width at half maximum is 9.3 degrees, while a vertical direction radiation angle in full width at half maximum is 17.2 degrees, and thus an aspect ratio of the laser beam is 1.84. This aspect ratio is much lower than the aspect ratios of 3.9 and 2.7 of the above-described first and second conventional laser devices of FIGS. 1 and 2, respectively.

It was also confirmed that the laser beam image at far-field of view has a reduced spike-like pattern intensity which is lower than one half of a waveguide mode peak intensity of the laser beam image. This reduced spike-like pattern intensity does not cause any significant stray light of the spike in an optical system.

A radiation loss of the laser device was estimated to be 0.5 cm$^{-1}$ from the spike-like pattern intensity. A total internal loss was estimated from a laser slope efficiency. An electrode loss of the p-electrode was estimated to be 2 cm$^{-1}$ by subtracting the estimated radiation loss and an absorption loss from the estimated total internal loss. The estimated radiation loss and the estimated electrode loss were well suppressed and reduced.

An upper limit of a crack-free thickness of the Al$_{0.05}$Ga$_{0.95}$N layer was estimated to be 2 micrometers from FIG. 5. The thickness of the above n-type Al$_{0.05}$Ga$_{0.95}$N cladding layer 2 is much smaller than the estimated upper limit of the crack-free thickness. A total thickness of the above n-type cladding layer 2 and the p-type cladding layer 7 is so still small as the estimated upper limit of the crack-free thickness. Thus, it was confirmed that the laser device is almost free of any significant crack.

As described above, the p-type cladding layer 7 has a thickness of 0.75 micrometers which is thicker than the thickness of 0.6 of the p-type super-lattice cladding layer 109 or 209 of each of the first and second conventional laser devices shown in FIGS. 1 and 2. Notwithstanding, the p-type cladding layer 7 has a sufficiently reduced Al-index of 0.05, which reduces a bulk resistance. Accordingly, the p-type cladding layer 7 contributes to the device resistance as small as the p-type super-lattice cladding layer 109 of each of the first and second conventional laser devices shown in FIGS. 1 and 2. In addition, as described above, the width of the ridge 11 is 2 micrometers. The device resistance of the laser device of this embodiment is as low as the above-described second conventional laser device.

Second Embodiment

A second embodiment according to the present invention will be described in detail with reference to the drawings. The gallium nitride based compound semiconductor laser has a similar structure to the above-described first embodiment shown in FIG. 7, for which reason the structure of the laser device of this embodiment will be described with reference again to FIG. 7.

The gallium nitride based compound semiconductor laser is formed over an n-type GaN substrate 1 which has a thickness of 100 micrometers. An n-type Al$_{0.05}$Ga$_{0.95}$N cladding layer 2 with a thickness of 1.05 micrometers is provided over the n-type GaN substrate 1. An n-type GaN optical guide layer 3 with a thickness of 0.2 micrometer is provided over the n-type Al$_{0.05}$Ga$_{0.95}$N cladding layer 2. An undoped multiple quantum well active layer 4 is provided over the n-type GaN optical guide layer 3. The multiple quantum well active layer 4 comprises 3 periods of alternating laminations of an undoped In$_{0.15}$Ga$_{0.85}$N quantum well layer with a thickness of 3 nanometers and an undoped In$_{0.02}$Ga$_{0.98}$N barrier layer with a thickness of 5 nanometers.

A p-type Al$_{0.2}$Ga$_{0.8}$N layer 5 with a thickness of 10 nanometers is provided over the undoped multiple quantum well active layer 4. A p-type GaN optical guide layer 6 with a thickness of 0.1 micrometer is provided over the p-type Al$_{0.2}$Ga$_{0.8}$N layer 5. A p-type Al$_{0.05}$Ga$_{0.95}$N cladding layer 7 with a thickness of 0.6 micrometers is provided over the p-type GaN optical guide layer 6. A p-type GaN contact layer 8 with a thickness of 15 nanometers is provided over the p-type Al$_{0.05}$Ga$_{0.95}$N cladding layer 7.

A part of the p-type GaN optical guide layer 6, the p-type Al$_{0.05}$Ga$_{0.95}$N cladding layer 7 and the p-type GaN contact layer 8 form a ridged structure 11 with a stripe-shape top surface having a width of 2 micrometers. An SiO$_2$ insulating layer 12 is provided on sloped side faces of the ridged structure 11 and on the surface of the p-type GaN optical guide layer 6. The SiO$_2$ insulating layer 12 has an opening over the top of the stripe-shape top surface of the ridged structure 11. The SiO$_2$ insulating layer 12 causes a current confinement into the p-type cladding layer 7.

A p-electrode 9 extends over the p-type GaN contact layer 8 and the insulating layer 12. An n-electrode 10 is provided on the bottom surface of the n-type GaN substrate 1.

The above structure satisfies the following five equations or conditions.

$0.15 \leq h$;

$|x-y| \leq 0.02$;

$0.02 \leq x \leq 0.06$;

$0.34x - 0.49 \leq d + 2h$; and $0.21y - 0.42 \leq d2 + h$, where "h1" (micrometers) represents a thickness of the optical guide layer 3; "h2" (micrometers) represents a thickness of the optical guide layer 6 under the ridge structure 11; "d1" (micrometers) represents a thickness of the n-type cladding layer 2; "d2" (micrometers) represents a thickness of the p-type cladding layer 7; "x" represents an Al-index of the n-type cladding layer 2; and "y" represents an Al-index of the p-type cladding layer 7.

It was confirmed that the laser device emits a laser beam with a wavelength of 400 nanometers, and the device has a low emission threshold current of 22 mA.

It was also confirmed that the laser beam image at far-field of view is an elliptically shaped beam, wherein a horizontal direction radiation angle in full width at half maximum is 9.6 degrees, while a vertical direction radiation angle in full width at half maximum is 19.9 degrees, and thus an aspect ratio of the laser beam is 2.07. This aspect ratio is much lower than the aspect ratios of 3.9 and 2.7 of the above-described first and second conventional laser devices of FIGS. 1 and 2, respectively.

It was also confirmed that the laser beam image at far-field of view has a reduced spike-like pattern intensity which is lower than one half of a waveguide mode peak intensity of the laser beam image. This reduced spike-like pattern intensity does not cause any significant stray light of the spike in an optical system.

A radiation loss of the laser device was estimated to be 0.5 cm$^{-1}$ from the spike-like pattern intensity. A total internal loss was estimated from a laser slope efficiency. An electrode loss of the p-electrode was estimated to be 2 cm$^{-1}$ by subtracting the estimated radiation loss and an absorption loss from the estimated total internal loss. The estimated radiation loss and the estimated electrode loss were well suppressed and reduced.

In this embodiment, as described above, the thickness of the optical guide layer 3 is increased to 0.2 micrometers for increasing the confined part of the light in the paired optical guide layers, for which reason even the thickness of the n-type cladding layer 2 is thinner than that of the first embodiment, the radiation loss is well suppressed. Further, even the thickness of the p-type cladding layer 7 is thinner than that of the first embodiment, the electrode loss is well suppressed.

An upper limit of a crack-free thickness of the $Al_{0.05}Ga_{0.95}N$ layer was estimated to be 2 micrometers from FIG. 5. The thickness of the above n-type $Al_{0.05}Ga_{0.95}N$ cladding layer 2 is much smaller than the estimated upper limit of the crack-free thickness. A total thickness of the above n-type cladding layer 2 and the p-type cladding layer 7 is still smaller than the estimated upper limit of the crack-free thickness. Thus, it was confirmed that the laser device is almost free of any significant crack.

As described above, the p-type cladding layer 7 has a thickness of 0.6 micrometers which is as small as the thickness of 0.6 of the p-type super-lattice cladding layer 109 or 209 of each of the first and second conventional laser devices shown in FIGS. 1 and 2. Notwithstanding, the p-type cladding layer 7 has a sufficiently reduced Al-index of 0.05, which reduces a bulk resistance. Accordingly, the p-type cladding layer 7 has a smaller contribution to the device resistance than the p-type super-lattice cladding layer 109 or 209 of each of the above first and second conventional laser devices shown in FIGS. 1 and 2. In addition, as described above, the width of the ridge 11 is 2 micrometers. The device resistance of the laser device of this embodiment is slightly lower than the above-described second conventional laser device.

Third Embodiment:

A third embodiment according to the present invention will be described in detail with reference to the drawings. The gallium nitride based compound semiconductor laser has a similar structure to the above-described first embodiment shown in FIG. 7, for which reason the structure of the laser device of this embodiment will be described with reference again to FIG. 7.

The gallium nitride based compound semiconductor laser is formed over an n-type GaN substrate 1 which has a thickness of 100 micrometers. An n-type $Al_{0.03}Ga_{0.97}N$ cladding layer 2 with a thickness of 1.9 micrometers is provided over the n-type GaN substrate 1. An n-type GaN optical guide layer 3 with a thickness of 0.1 micrometer is provided over the n-type $Al_{0.03}Ga_{0.97}N$ cladding layer 2. An undoped multiple quantum well active layer 4 is provided over the n-type GaN optical guide layer 3. The multiple quantum well active layer 4 comprises 3 periods of alternating laminations of an undoped $In_{0.15}Ga_{0.85}N$ quantum well layer with a thickness of 3 nanometers and an undoped $In_{0.02}Ga_{0.99}N$ barrier layer with a thickness of 5 nanometers.

A p-type $Al_{0.2}Ga_{0.8}N$ layer 5 with a thickness of 10 nanometers is provided over the undoped multiple quantum well active layer 4. A p-type GaN optical guide layer 6 with a thickness of 0.1 micrometer is provided over the p-type $Al_{0.2}Ga_{0.8}N$ layer 5. A p-type $Al_{0.03}Ga_{0.97}N$ cladding layer 7 with a thickness of 1 micrometer is provided over the p-type GaN optical guide layer 6. A p-type GaN contact layer 8 with a thickness of 15 nanometers is provided over the p-type $Al_{0.03}Ga_{0.97}N$ cladding layer 7.

A part of the p-type GaN optical guide layer 6, the p-type $Al_{00.3}Ga_{0.97}N$ cladding layer 7 and the p-type GaN contact layer 8 form a ridged structure 11 with a stripe-shape top surface having a width of 2 micrometers. An $SiO_2$ insulating layer 12 is provided on sloped side faces of the ridged structure 11 and on the surface of the p-type GaN optical guide layer 6. The $SiO_2$ insulating layer 12 has an opening over the top of the stripe-shape top surface of the ridged structure 11. The $SiO_2$ insulating layer 12 causes a current confinement into the p-type cladding layer 7.

A p-electrode 9 extends over the p-type GaN contact layer 8 and the insulating layer 12. An n-electrode 10 is provided on the bottom surface of the n-type GaN substrate 1.

The above structure satisfies the following five equations or conditions.

$0.15 \leq h$;

$|x-y| \leq 0.02$;

$0.02 \leq x \leq 0.06$;

$0.34x - 0.49 \leq d + 2h$; and $0.21y - 0.42 \leq d2 + h$, where "h1" (micrometers) represents a thickness of the optical guide layer 3; "h2" (micrometers) represents a thickness of the optical guide layer 6 under the ridge structure 11; "d1" (micrometers) represents a thickness of the n-type cladding layer 2; "d2" (micrometers) represents a thickness of the p-type cladding layer 7; "x" represents an Al-index of the n-type cladding layer 2; and "y" represents an Al-index of the p-type cladding layer 7.

It was confirmed that the laser device emits a laser beam with a wavelength of 408 nanometers, and the device has a low emission threshold current of 26 mA.

It was also confirmed that the laser beam image at far-field of view is an elliptically shaped beam, wherein a horizontal direction radiation angle in full width at half maximum is 7.5 degrees, while a vertical direction radiation angle in full width at half maximum is 11.9 degrees, and thus an aspect ratio of the laser beam is 1.59. This aspect ratio is much lower than the aspect ratios of 3.9 and 2.7 of the above-described first and second conventional laser devices of FIGS. 1 and 2, respectively.

It was also confirmed that the laser beam image at far-field of view has a reduced spike-like pattern intensity which is lower than one half of a waveguide mode peak intensity of the laser beam image. This reduced spike-like pattern intensity does not cause any significant stray light of the spike in an optical system.

A radiation loss of the laser device was estimated to be 0.5 cm$^{-1}$ from the spike-like pattern intensity. A total internal loss was estimated from a laser slope efficiency. An electrode loss of the p-electrode was estimated to be 2 cm$^{-1}$ by subtracting the estimated radiation loss and an absorption loss from the estimated total internal loss. The estimated radiation loss and the estimated electrode loss were well suppressed and reduced.

In this embodiment, as described above, the respective Al-indexes of the n-type and p-type cladding layers 2 and 7 are reduced for increasing the confined part of the light in the n-type and p-type cladding layers 2 and 7, for which reason the thickness of the n-type cladding layer 2 is larger than that of the first embodiment for suppressing the radiation loss. Further, even the thickness of the p-type cladding layer 7 is larger than that of the first embodiment for suppressing the electrode loss.

An upper limit of a crack-free thickness of the $Al_{0.03}Ga_{0.97}N$ layer was estimated to be 5 micrometers from FIG. 5. The thickness of the above n-type $Al_{0.05}Ga_{0.95}N$ cladding layer 2 is much smaller than the estimated upper limit of the crack-free thickness. A total thickness of the above n-type cladding layer 2 and the p-type cladding layer 7 is still smaller than the estimated upper limit of the crack-free thickness. Thus, it was confirmed that the laser device is almost free of any significant crack.

As described above, the p-type cladding layer 7 has a thickness of 1 micrometer which is larger than the thickness of 0.6 of the p-type super-lattice cladding layer 109 or 209 of each of the first and second conventional laser devices shown in FIGS. 1 and 2. Notwithstanding, the p-type cladding layer 7 has a sufficiently reduced Al-index of 0.03, which reduces a bulk resistance. Accordingly, the p-type cladding layer 7 has such a contribution to the device resistance as the p-type super-lattice cladding layer 109 of each of the first and second conventional laser devices shown in FIGS. 1 and 2. In addition, as described above, the width of the ridge 11 is 2 micrometers. The device resistance of the laser device of this embodiment is such small as the above-described second conventional laser device.

Fourth Embodiment:

A fourth embodiment according to the present invention will be described in detail with reference to the drawings. The gallium nitride based compound semiconductor laser has a similar structure to the above-described first embodiment shown in FIG. 7, for which reason the structure of the laser device of this embodiment will be described with reference again to FIG. 7.

The gallium nitride based compound semiconductor laser is formed over an n-type GaN substrate 1 which has a thickness of 100 micrometers. An n-type $Al_{0.05}Ga_{0.95}N$ cladding layer 2 with a thickness of 1.5 micrometers is provided over the n-type GaN substrate 1. An n-type GaN optical guide layer 3 with a thickness of 0.1 micrometer is provided over the n-type $Al_{0.05}Ga_{0.95}N$ cladding layer 2. An undoped multiple quantum well active layer 4 is provided over the n-type GaN optical guide layer 3. The multiple quantum well active layer 4 comprises 3 periods of alternating laminations of an undoped $In_{0.15}Ga_{0.85}N$ quantum well layer with a thickness of 3 nanometers and an undoped $In_{0.02}Ga_{0.98}N$ barrier layer with a thickness of 5 nanometers.

A p-type $Al_{0.2}Ga_{0.8}N$ layer 5 with a thickness of 10 nanometers is provided over the undoped multiple quantum well active layer 4. A p-type GaN optical guide layer 6 with a thickness of 0.1 micrometer is provided over the p-type $Al_{0.2}Ga_{0.8}N$ layer 5. A p-type $Al_{0.07}Ga_{0.93}N$ cladding layer 7 with a thickness of 0.55 micrometers is provided over the p-type GaN optical guide layer 6. A p-type GaN contact layer 8 with a thickness of 15 nanometers is provided over the p-type $Al_{0.07}Ga_{0.93}N$ cladding layer 7.

A part of the p-type GaN optical guide layer 6, the p-type $Al_{0.07}Ga_{0.93}N$ cladding layer 7 and the p-type GaN contact layer 8 form a ridged structure 11 with a stripe-shape top surface having a width of 2 micrometers. An $SiO_2$ insulating layer 12 is provided on sloped side faces of the ridged structure 11 and on the surface of the p-type GaN optical guide layer 6. The $SiO_2$ insulating layer 12 has an opening over the top of the stripe-shape top surface of the ridged structure 11. The $SiO_2$ insulating layer 12 causes a current confinement into the p-type cladding layer 7.

A p-electrode 9 extends over the p-type GaN contact layer 8 and the insulating layer 12. An n-electrode 10 is provided on the bottom surface of the n-type GaN substrate 1.

The above structure satisfies the following five equations or conditions.

$$0.15 \leq h;$$

$$y-x>0.02;$$

$$0.03 \leq x \leq 0.06;$$

$$0.47x-0.5 \leq d1+4h; \text{ and}$$

$$0.2y-0.33 \leq d2+0.5h,$$

where "h1" (micrometers) represents a thickness of the optical guide layer 3; "h2" (micrometers) represents a thickness of the optical guide layer 6; "d1" (micrometers) represents a thickness of the n-type cladding layer 2; "d2" (micrometers) represents a thickness of the p-type cladding layer 7; "x" represents an Al-index of the n-type cladding layer 2; and "y" represents an Al-index of the p-type cladding layer 7.

It was confirmed that the laser device emits a laser beam with a wavelength of 400 nanometers, and the device has a low emission threshold current of 21 mA.

It was also confirmed that the laser beam image at far-field of view is an elliptically shaped beam, wherein a horizontal direction radiation angle in full width at half maximum is 8.9 degrees, while a vertical direction radiation angle in full width at half maximum is 17.5 degrees, and thus an aspect ratio of the laser beam is 1.96. This aspect ratio is much lower than the aspect ratios of 3.9 and 2.7 of the above-described first and second conventional laser devices of FIGS. 1 and 2, respectively.

It was also confirmed that the laser beam image at far-field of view has a reduced spike-like pattern intensity which is lower than one half of a waveguide mode peak intensity of the laser beam image. This reduced spike-like pattern intensity does not cause any significant stray light of the spike in an optical system.

The p-type cladding layer 7 is smaller in refractive index than the n-type cladding layer 2. Namely, the n-type cladding layer 2 and the p-type cladding layer 7 provide, in combination, an asymmetrical distribution of refractive index in the vertical direction to the interfaces of the active layer. This asymmetrical distribution of refractive index makes it easy to reduce the vertical radiation angle. The smaller refractive index of the p-type cladding layer 7 makes it easy to reduce the confined part of the light in the p-type cladding layer 7, for which reason even the thickness of the p-type cladding layer 7 is relatively small, the electrode loss is well suppressed.

A radiation loss of the laser device was estimated to be 0.5 cm$^{-1}$ from the spike-like pattern intensity. A total internal loss was estimated from a laser slope efficiency. An electrode loss of the p-electrode was estimated to be 2 cm$^{-1}$ by subtracting the estimated radiation loss and an absorption loss from the estimated total internal loss. The estimated radiation loss and the estimated electrode loss were well suppressed and reduced.

In this embodiment, as described above, the Al-index of the n-type cladding layer 2 is reduced as compared to the p-type cladding layer 7 for providing the asymmetrical distribution of the refractive index in the vertical direction to the interfaces of the active layer, wherein the confined part of the light in the n-type cladding layer 2 is increased. For this reason, the thickness of the n-type cladding layer 2 becomes larger than that of the first embodiment for the purpose of suppressing the radiation loss.

An upper limit of a crack-free thickness of the $Al_{0.05}Ga_{0.95}N$ layer was estimated to be 2 micrometers from FIG. 5. The thickness of the above n-type $Al_{0.05}Ga_{0.95}N$ cladding layer 2 is much smaller than the estimated upper limit of the crack-free thickness. Thus, it was confirmed that the laser device is almost free of any significant crack.

As described above, the p-type cladding layer 7 has a thickness of 0.55 micrometer which is as small as the thickness of 0.6 of the p-type super-lattice cladding layer 109 or 209 of each of the first and second conventional laser devices shown in FIGS. 1 and 2. Also, the p-type cladding layer 7 has a sufficiently reduced Al-index of 0.07, which reduces a bulk resistance. Accordingly, the p-type cladding layer 7 has such a contribution to the device resistance as the p-type super-lattice cladding layer 109 of each of the first and second conventional laser devices shown in FIGS. 1 and 2. In addition, as described above, the width of the ridge 11 is 2 micrometers. The device resistance of the laser device of this embodiment is such small as the above-described second conventional laser device.

Fifth Embodiment:

A fifth embodiment according to the present invention will be described in detail with reference to the drawings. The gallium nitride based compound semiconductor laser has a similar structure to the above-described first embodiment shown in FIG. 7, for which reason the structure of the laser device of this embodiment will be described with reference again to FIG. 7.

The gallium nitride based compound semiconductor laser is formed over an n-type GaN substrate 1 which has a thickness of 100 micrometers. An n-type $Al_{0.03}Ga_{0.97}N$ cladding layer 2 with a thickness of 2.7 micrometers is provided over the n-type GaN substrate 1. An n-type GaN optical guide layer 3 with a thickness of 0.1 micrometer is provided over the n-type $Al_{0.03}Ga_{0.97}N$ cladding layer 2. An undoped multiple quantum well active layer 4 is provided over the n-type GaN optical guide layer 3. The multiple quantum well active layer 4 comprises 3 periods of alternating laminations of an undoped $In_{0.15}Ga_{0.85}N$ quantum well layer with a thickness of 3 nanometers and an undoped $In_{0.02}Ga_{0.98}N$ barrier layer with a thickness of 5 nanometers.

A p-type $Al_{0.2}Ga_{0.8}N$ layer 5 with a thickness of 10 nanometers is provided over the undoped multiple quantum well active layer 4. A p-type GaN optical guide layer 6 with a thickness of 0.1 micrometer is provided over the p-type $Al_{0.2}Ga_{0.8}N$ layer 5. A p-type $Al_{0.05}Ga_{0.95}N$ cladding layer 7 with a thickness of 0.58 micrometers is provided over the p-type GaN optical guide layer 6. A p-type GaN contact layer 8 with a thickness of 15 nanometers is provided over the p-type $Al_{0.05}Ga_{0.95}N$ cladding layer 7.

A part of the p-type GaN optical guide layer 6, the p-type $Al_{0.07}Ga_{0.93}N$ cladding layer 7 and the p-type GaN contact layer 8 form a ridged structure 11 with a stripe-shape top surface having a width of 2 micrometers. An $SiO_2$ insulating layer 12 is provided on sloped side faces of the ridged structure 11 and on the surface of the p-type GaN optical guide layer 6. The $SiO_2$ insulating layer 12 has an opening over the top of the stripe-shape top surface of the ridged structure 11. The $SiO_2$ insulating layer 12 causes a current confinement into the p-type cladding layer 7.

A p-electrode 9 extends over the p-type GaN contact layer 8 and the insulating layer 12. An n-electrode 10 is provided on the bottom surface of the n-type GaN substrate 1.

The above structure satisfies the following five equations or conditions.

$$0.15 \leq h;$$

$$y-x > 0.02;$$

$$0.03 \leq x \leq 0.06;$$

$$0.47x - 0.5d1 + 4h; \text{ and}$$

$$0.2y - 0.33 \leq d2 + 0.5h,$$

where "h1" (micrometers) represents a thickness of the optical guide layer 3; "h2" (micrometers) represents a thickness of the optical guide layer 6; "d1" (micrometers) represents a thickness of the n-type cladding layer 2; "d2" (micrometers) represents a thickness of the p-type cladding layer 7; "x" represents an Al-index of the n-type cladding layer 2; and "y" represents an Al-index of the p-type cladding layer 7.

It was confirmed that the laser device emits a laser beam with a wavelength of 399 nanometers, and the device has a low emission threshold current of 27 mA.

It was also confirmed that the laser beam image at far-field of view is an elliptically shaped beam, wherein a horizontal direction radiation angle in full width at half maximum is 5.6 degrees, while a vertical direction radiation angle in full width at half maximum is 10 degrees, and thus an aspect ratio of the laser beam is 1.79. This aspect ratio is much lower than the aspect ratios of 3.9 and 2.7 of the above-described first and second conventional laser devices of FIGS. 1 and 2, respectively.

It was also confirmed that the laser beam image at far-field of view has a reduced spike-like pattern intensity which is lower than one half of a waveguide mode peak intensity of the laser beam image. This reduced spike-like pattern intensity does not cause any significant stray light of the spike in an optical system.

The p-type cladding layer 7 is smaller in refractive index than the n-type cladding layer 2. Namely, the n-type cladding layer 2 and the p-type cladding layer 7 provide, in combination, an asymmetrical distribution of refractive index in the vertical direction to the interfaces of the active layer. This asymmetrical distribution of refractive index makes it easy to reduce the vertical radiation angle. The smaller refractive index of the p-type cladding layer 7 makes it easy to reduce the confined part of the light in the p-type cladding layer 7, for which reason even the thickness of the p-type cladding layer 7 is relatively small, the electrode loss is well suppressed.

A radiation loss of the laser device was estimated to be 0.5 cm$^{-1}$ from the spike-like pattern intensity. A total internal loss was estimated from a laser slope efficiency. An electrode loss of the p-electrode was estimated to be 2 cm$^{-1}$ by subtracting the estimated radiation loss and an absorption loss from the estimated total internal loss. The estimated radiation loss and the estimated electrode loss were well suppressed and reduced.

In this embodiment, as described above, the Al-index of the n-type cladding layer 2 is reduced as compared to the p-type cladding layer 7 for providing the asymmetrical distribution of the refractive index in the vertical direction to the interfaces of the active layer, wherein the confined part of the light in the n-type cladding layer 2 is increased. For this reason, the thickness of the n-type cladding layer 2 becomes larger than that of the first embodiment for the purpose of suppressing the radiation loss.

An upper limit of a crack-free thickness of the $Al_{0.05}Ga_{0.95}N$ layer was estimated to be 2 micrometers from FIG. 5. The thickness of the above n-type $Al_{0.05}Ga_{0.95}N$ cladding layer 2 is much smaller than the estimated upper limit of the crack-free thickness. Thus, it was confirmed that the laser device is almost free of any significant crack.

As described above, the p-type cladding layer 7 has a thickness of 0.58 micrometer which is as small as the thickness of 0.6 of the p-type super-lattice cladding layer 109 or 209 of each of the first and second conventional laser devices shown in FIGS. 1 and 2. Also, the p-type cladding layer 7 has a sufficiently reduced Al-index of 0.05, which reduces a bulk resistance. Accordingly, the p-type cladding layer 7 has a slightly smaller contribution to the device resistance than the p-type super-lattice cladding layer 109 or 209 of each of the above first and second conventional laser devices shown in FIGS. 1 and 2. In addition, as described above, the width of the ridge 11 is 2 micrometers. The device resistance of the laser device of this embodiment is smaller than the above-described second conventional laser device.

Sixth Embodiment:

A sixth embodiment according to the present invention will be described in detail with reference to the drawings. The gallium nitride based compound semiconductor laser has a similar structure to the above-described first embodiment shown in FIG. 7, for which reason the structure of the laser device of this embodiment will be described with reference again to FIG. 7.

The gallium nitride based compound semiconductor laser is formed over an n-type GaN substrate 1 which has a thickness of 100 micrometers. An n-type $Al_{0.05}Ga_{0.95}N$ cladding layer 2 with a thickness of 1.5 micrometers is provided over the n-type GaN substrate 1. An n-type GaN optical guide layer 3 with a thickness of 0.2 micrometer is provided over the n-type $Al_{0.05}Ga_{0.09}N$ cladding layer 2. An undoped multiple quantum well active layer 4 is provided over the n-type GaN optical guide layer 3. The multiple quantum well active layer 4 comprises 3 periods of alternating laminations of an undoped $In_{0.15}Ga_{0.85}N$ quantum well layer with a thickness of 3 nanometers and an undoped $In_{0.02}Ga_{0.98}N$ barrier layer with a thickness of 5 nanometers.

A p-type $Al_{0.2}Ga_{0.8}N$ layer 5 with a thickness of 10 nanometers is provided over the undoped multiple quantum well active layer 4. A p-type GaN optical guide layer 6 with a thickness of 0.1 micrometer is provided over the p-type $Al_{0.2}Ga_{0.8}N$ layer 5. A p-type $Al_{0.09}Ga_{0.91}N$ cladding layer 7 with a thickness of 0.43 micrometers is provided over the p-type GaN optical guide layer 6. A p-type GaN contact layer 8 with a thickness of 15 nanometers is provided over the p-type $Al_{0.08}Ga_{0.91}N$ cladding layer 7.

A part of the p-type GaN optical guide layer 6, the p-type $Al_{0.08}Ga_{0.91}N$ cladding layer 7 and the p-type GaN contact layer 8 form a ridged structure 11 with a stripe-shape top surface having a width of 2 micrometers. An $SiO_2$ insulating layer 12 is provided on sloped side faces of the ridged structure 11 and on the surface of the p-type GaN optical guide layer 6. The $SiO_2$ insulating layer 12 has an opening over the top of the stripe-shape top surface of the ridged structure 11. The $SiO_2$ insulating layer 12 causes a current confinement into the p-type cladding layer 7.

A p-electrode 9 extends over the p-type GaN contact layer 8 and the insulating layer 12. An n-electrode 10 is provided on the bottom surface of the n-type GaN substrate 1.

The above structure satisfies the following five equations or conditions.

$$0.15 \leq h;$$

$$y-x>0.02;$$

$$0.03 \leq x \leq 0.06;$$

$$0.47x-0.5 \leq d1+4h; \text{ and}$$

$$0.2y-0.33 \leq d2+0.5h,$$

where "h1" (micrometers) represents a thickness of the optical guide layer 3; "h2" (micrometers) represents a thickness of the optical guide layer 6 "d1" (micrometers) represents a thickness of the n-type cladding layer 2; "d2" (micrometers) represents a thickness of the p-type cladding layer 7; "x" represents an Al-index of the n-type cladding layer 2 and "y" represents an Al-index of the p-type cladding layer 7.

It was confirmed that the laser device emits a laser beam with a wavelength of 406 nanometers, and the device has a low emission threshold current of 21 mA.

It was also confirmed that the laser beam image at far-field of view is an elliptically shaped beam, wherein a horizontal direction radiation angle in full width at half maximum is 9.3 degrees, while a vertical direction radiation angle in full width at half maximum is 21.2 degrees, and thus an aspect ratio of the laser beam is 2.27. This aspect ratio is much lower than the aspect ratios of 3.9 and 2.7 of the above-described first and second conventional laser devices of FIGS. 1 and 2, respectively.

It was also confirmed that the laser beam image at far-field of view has a reduced spike-like pattern intensity which is lower than one half of a waveguide mode peak intensity of the laser beam image. This reduced spike-like pattern intensity does not cause any significant stray light of the spike in an optical system.

The p-type cladding layer 7 is smaller in refractive index than the n-type cladding layer 2. Namely, the n-type cladding layer 2 and the p-type cladding layer 7 provide, in combination, an asymmetrical distribution of refractive index in the vertical direction to the interfaces of the active layer. This asymmetrical distribution of refractive index makes it easy to reduce the vertical radiation angle. The smaller refractive index of the p-type cladding layer 7 makes it easy to reduce the confined part of the light in the p-type cladding layer 7, for which reason even the thickness of the p-type cladding layer 7 is relatively small, the electrode loss is well suppressed. Further, the thickness of the optical guide layer 3 is increased to 0.2 micrometers for increasing the confined part of the light in the optical guide layer 3, for which reason even the thickness of the n-type cladding layer 2 is relatively small, the radiation loss is well suppressed.

A radiation loss of the laser device was estimated to be 0.5 cm$^{-1}$ from the spike-like pattern intensity. A total internal loss was estimated from a laser slope efficiency. An electrode loss of the p-electrode was estimated to be 2 cm$^{-1}$ by subtracting the estimated radiation loss and an absorption loss from the estimated total internal loss. The estimated radiation loss and the estimated electrode loss were well suppressed and reduced.

An upper limit of a crack-free thickness of the $Al_{0.05}Ga_{0.95}N$ layer was estimated to be 2 micrometers from FIG. 5. The thickness of the above n-type $Al_{0.05}Ga_{0.95}N$ cladding layer 2 is much smaller than the estimated upper limit of the crack-free thickness. Thus, it was confirmed that the laser device is almost free of any significant crack.

As described above, the p-type cladding layer 7 has a thickness of 0.43 micrometer which is smaller than the thickness of 0.6 of the p-type super-lattice cladding layer 109 or 209 of each of the first and second conventional laser devices shown in FIGS. 1 and 2. Also, the p-type cladding layer 7 has a slightly large Al-index of 0.09, which provides a slightly large bulk resistance. Accordingly, the p-type cladding layer 7 has such a contribution to the device resistance as the p-type super-lattice cladding layer 109 of each of the first and second conventional laser devices shown in FIGS. 1 and 2. In addition, as described above, the width of the ridge 11 is 2 micrometers. The device resistance of the laser device of this embodiment is as small as the above-described second conventional laser device.

Seventh Embodiment:

A seventh embodiment according to the present invention will be described in detail with reference to the drawings. The gallium nitride based compound semiconductor laser has a distinctively different structure from the above-described structures of the first to sixth embodiments. In the first to sixth embodiments, the laser device has the ridge structure for providing an effective difference in refractive index in horizontal direction to the active layer. In the above fourth to sixth embodiments, the n-type and p-type cladding layers provide, in combination, the asymmetrical distribution of refractive index, wherein the n-type cladding layer is larger in refractive index than the p-type cladding layer. This asymmetrical distribution of refractive index causes that the optical distribution is shifted to the n-type cladding layer. This makes it difficult to take a desired large effective difference in refractive index in the horizontal direction to the active layer, namely difficult to take a desired large horizontal radiation angle. In order to avoid this advantages, the present seventh embodiment provides a buried hetero-structure laser device which is designed to realize a further reduction in aspect ratio.

Figure 9:
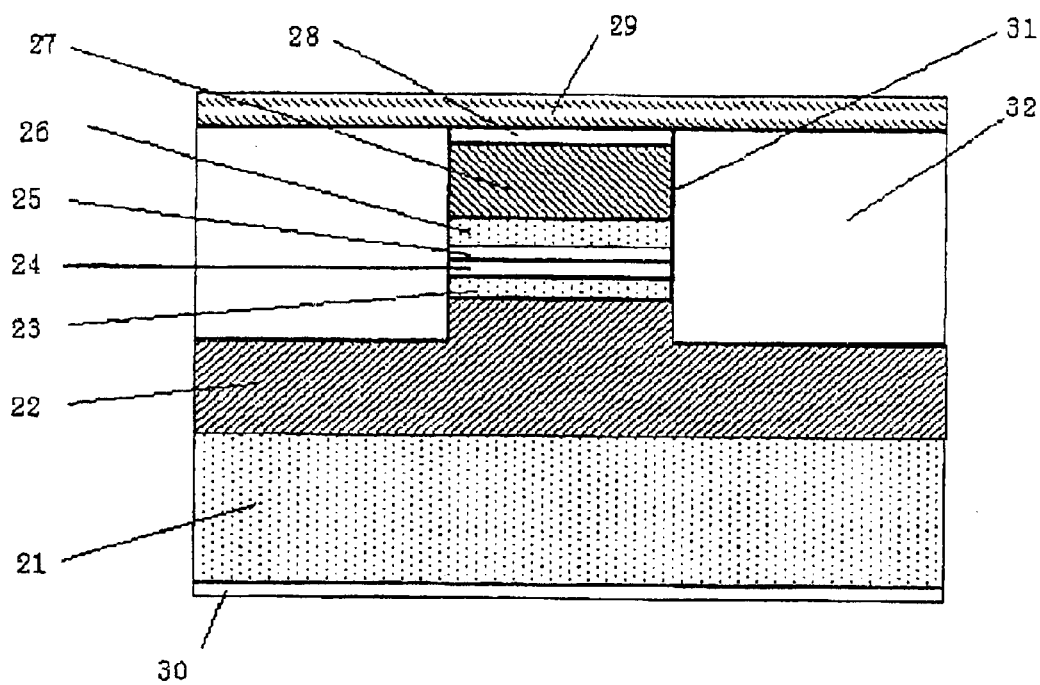
FIG. 9 is a fragmentary cross sectional elevation view of a typical example of the novel gallium nitride based compound semiconductor laser with a buried hetero-structure in the seventh embodiment in accordance with the present invention.

FIG. 9 is a fragmentary cross sectional elevation view of a typical example of the novel gallium nitride based compound semiconductor laser with a buried hetero-structure in the seventh embodiment in accordance with the present invention.

The gallium nitride based compound semiconductor laser is formed over an n-type GaN substrate 21 which has a thickness of 100 micrometers. An n-type $Al_{0.03}Ga_{0.97}N$ cladding layer 22 with a thickness of 2.7 micrometers is provided over the n-type GaN substrate 21. An n-type GaN optical guide layer 23 with a thickness of 0.1 micrometer is provided over the n-type $Al_{0.03}Ga_{0.97}N$ cladding layer 22. An undoped multiple quantum well active layer 24 is provided over the n-type GaN optical guide layer 23. The multiple quantum well active layer 24 comprises 3 periods of alternating laminations of an undoped $In_{0.15}Ga_{0.85}N$ quantum well layer with a thickness of 3 nanometers and an undoped $In_{0.02}Ga_{0.98}N$ barrier layer with a thickness of 5 nanometers.

A p-type $Al_{0.2}Ga_{0.8}N$ layer 25 with a thickness of 10 nanometers is provided over the undoped multiple quantum well active layer 24. A p-type GaN optical guide layer 26 with a thickness of 0.1 micrometer is provided over the p-type $Al_{0.2}Ga_{0.8}N$ layer 25. A p-type $Al_{0.05}Ga_{0.95}N$ cladding layer 27 with a thickness of 0.58 micrometers is provided over the p-type GaN optical guide layer 26. A p-type GaN contact layer 28 with a thickness of 15 nanometers is provided over the p-type $Al_{0.05}Ga_{0.95}N$ cladding layer 27.

A mesa structure 31 comprises a part of the n-type $Al_{0.03}Ga_{0.97}N$ cladding layer 22, the n-type GaN optical guide layer 23, the undoped multiple quantum well active layer 24, the p-type $Al_{0.2}Ga_{0.8}N$ layer 25, the p-type GaN optical guide layer 26, the p-type $Al_{0.05}Ga_{0.95}N$ cladding layer 27 and the p-type GaN contact layer 28. The mesa structure may be formed by a selective etching to the above layers. The mesa structure 31 has a stripe-shape top surface having a width of 2 micrometers.

Further, a highly resistive $Al_{0.05}Ga_{0.95}N$ current confinement layer 32 is provided, which surrounds the mesa structure 31 except over the top surface of the mesa structure 31. Namely, the highly resistive $Al_{0.05}Ga_{0.95}N$ current confinement layer 32 is formed on the vertical side walls of the mesa structure 31 and on the horizontal surface of the n-type $Al_{0.03}Ga_{0.97}N$ cladding layer 22. The highly resistive $Al_{0.05}Ga_{0.09}N$ current confinement layer 32 causes a current confinement into the mesa structure 31. The highly resistive $Al_{0.05}Ga_{0.95}N$ current confinement layer 32 is lower in refractive index than the active layer 24 and the optical guide layers 23 and 26, so that the highly resistive $Al_{0.05}Ga_{0.95}N$ current confinement layer 32 causes a horizontal optical confinement into the mesa structure 31.

A p-electrode 29 extends over the p-type GaN contact layer 28 and the insulating layer 32. An n-electrode 30 is provided on the bottom surface of the n-type GaN substrate 21.

The above structure satisfies the following five equations or conditions.

$$0.15 \leq h;$$

$$y-x > 0.02;$$

$$0.03 \leq x \leq 0.06;$$

$$0.47x - 0.5 \leq d1 + 4h; \text{ and}$$

$$0.2y - 0.33 \leq d2 + 0.5h,$$

where "h1" (micrometers) represents a thickness of the optical guide layer 23; "h2" (micrometers) represents a thickness of the optical guide layer 26; "d1" (micrometers) represents a thickness of the n-type cladding layer 22; "x" (micrometers) represents a thickness of the p-type cladding layer 27; "x" represents an Al-index of the n-type cladding layer 22; and "y" represents an Al-index of the p-type cladding layer 27.

It was confirmed that the laser device emits a laser beam with a wavelength of 410 nanometers, and the device has a low emission threshold current of 26 mA.

Figure 10:
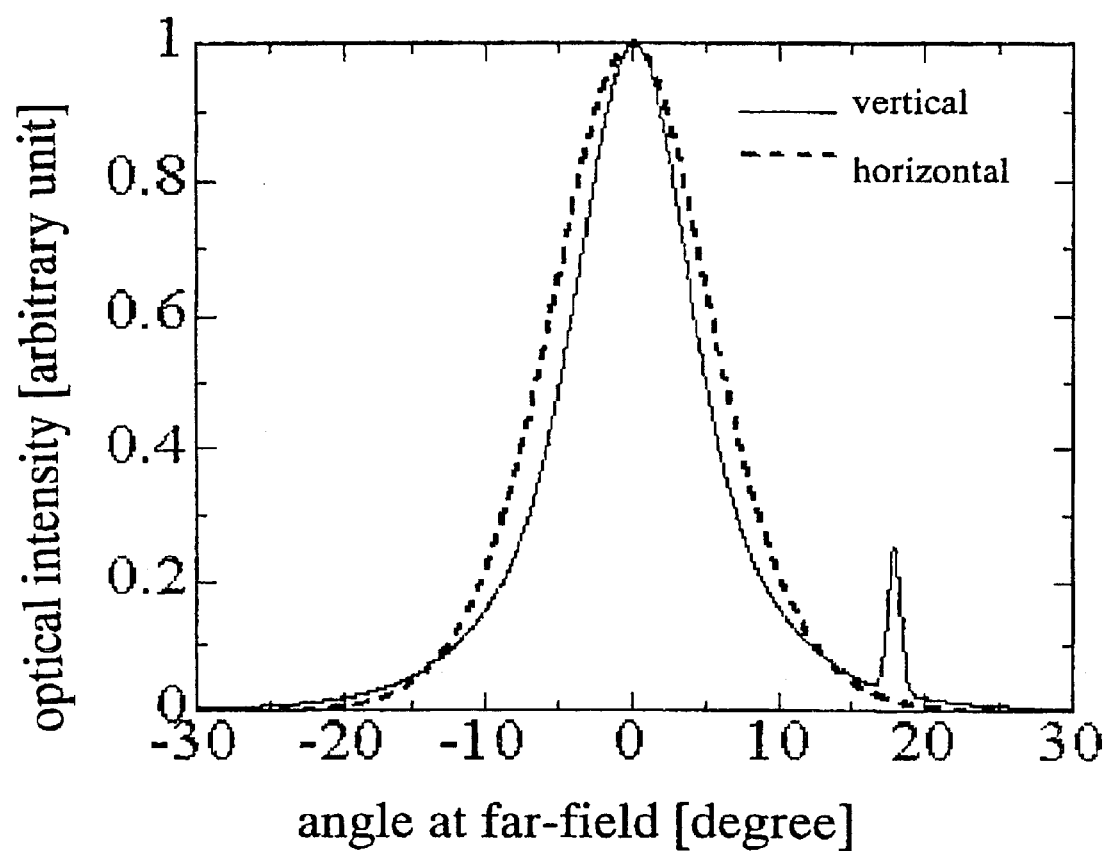
FIG. 10 is a diagram illustrative of variation in optical intensity in arbitrary unit of the laser beam emitted from the laser device over angle of far-field of view in both vertical and horizontal directions in degree unit.

FIG. 10 is a diagram illustrative of variation in optical intensity in arbitrary unit of the laser beam emitted from the laser device over angle of far-field of view in both vertical and horizontal directions in degree unit. Real line represents the laser beam image at far-field of view in the vertical direction to the interfaces of the active layer. Broken line represents the laser beam image at far-field of view in the horizontal direction to the interfaces of the active layer.

It was also confirmed that the laser beam image at far-field of view is a generally circle-shaped beam, wherein a horizontal direction radiation angle in full width at half maximum is 9.8 degrees, while a vertical direction radiation angle in full width at half maximum is 10.8 degrees, and thus an aspect ratio of the laser beam is 1.1. This aspect ratio is greatly lower than the aspect ratios of 3.9 and 2.7 of the above-described first and second conventional laser devices of FIGS. 1 and 2, respectively.

It was also confirmed that the laser beam image at far-field of view has a reduced spike-like pattern intensity which is lower than one half of a waveguide mode peak intensity of the laser beam image. This reduced spike-like pattern intensity does not cause any significant stray light of the spike in an optical system.

The p-type cladding layer 27 is smaller in refractive index than the n-type cladding layer 22. Namely, the n-type cladding layer 22 and the p-type cladding layer 27 provide, in combination, an asymmetrical distribution of refractive index in the vertical direction to the interfaces of the active layer. This asymmetrical distribution of refractive index makes it easy to reduce the vertical radiation angle. The smaller refractive index of the p-type cladding layer 27 makes it easy to reduce the confined part of the light in the p-type cladding layer 27, for which reason even the thickness of the p-type cladding layer 27 is relatively small, the electrode loss is well suppressed.

A radiation loss of the laser device was estimated to be 0.5 $cm^{-1}$ from the spike-like pattern intensity. A total internal loss was estimated from a laser slope efficiency. An electrode loss of the p-electrode was estimated to be 2 $cm^{-1}$ by subtracting the estimated radiation loss and an absorption loss from the estimated total internal loss. The estimated radiation loss and the estimated electrode loss were well suppressed and reduced.

In this embodiment, as described above, the Al-index of the n-type cladding layer 22 is reduced as compared to the p-type cladding layer 27 for providing the asymmetrical distribution of the refractive index in the vertical direction to the interfaces of the active layer, wherein the confined part of the light in the n-type cladding layer 22 is increased. For this reason, the thickness of the n-type cladding layer 22 becomes larger than that of the first embodiment for the purpose of suppressing the radiation loss.

An upper limit of a crack-free thickness of the $Al_{0.03}Ga_{0.97}N$ layer was estimated to be 5 micrometers from FIG. 5. The thickness of the above n-type $Al_{0.03}Ga_{0.97}N$ cladding layer 22 is much smaller than the estimated upper limit of the crack-free thickness. Thus, it was confirmed that the laser device is almost free of any significant crack.

As described above, the p-type cladding layer 27 has a thickness of 0.58 micrometer which is as small as the thickness of 0.6 of the p-type super-lattice cladding layer 109 or 209 of each of the first and second conventional laser devices shown in FIGS. 1 and 2. Also, the p-type cladding layer 7 has a sufficiently reduced Al-index of 0.05, which reduces a bulk resistance. Accordingly, the p-type cladding layer 7 has a slightly smaller contribution to the device resistance than the p-type super-lattice cladding layer 109 or 209 of each of the first and second conventional laser devices shown in FIGS. 1 and 2. In addition, as described above, the width of the ridge 31 is 2 micrometers. The device resistance of the laser device of this embodiment is smaller than the above-described second conventional laser device.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A light-emitting semiconductor device including:
   a nitride based compound semiconductor multilayer structure which further includes:
   an active layer;
   a first-side cladding layer under said active layer;
   a second-side cladding layer over said active layer; and
   at least one of a first-side optical guide layer over said first-side cladding layer and under said active layer and a second-side optical guide layer over said active layer and under said second-side cladding layer,
   wherein the following four equations are satisfied:

$0.15 \leq h$;

$|x-y| \leq 0.02$;

$0.02 \leq x \leq 0.06$; and $0.34x - 0.49 \leq d1 + 2h$, where "h" (micrometers) represents a total thickness of said at least one of said first-side and second-side optical guide layers; "d1" (micrometers) represents a thickness of said first-side cladding layer; "x" represents a first Al-index of a first AlGaN bulk crystal which has a first refractive index equal to a first averaged refractive index of said first-side cladding layer; and "y" represents a second Al-index of a second AlGaN bulk crystal which has a second refractive index equal to a second averaged refractive index of said second-side cladding layer.

2. The light-emitting semiconductor device as claimed in claim 1, wherein said first-side and second-side cladding layers provide, in combination, a generally symmetrical distribution of refractive index in a direction vertical to interfaces of said nitride based compound semiconductor multilayer structure.

3. The light-emitting semiconductor device as claimed in claim 1, wherein said light-emitting semiconductor device emits a laser beam with a wavelength in a range of 380 nanometers to 420 nanometers.

4. The light-emitting semiconductor device as claimed in claim 1, wherein said nitride based compound semiconductor multilayer structure extends over a GaN base layer.

5. The light-emitting semiconductor device as claimed in claim 1, wherein each of said first-side and second-side cladding layers comprises a gallium nitride based compound semiconductor bulk crystal layer.

6. The light-emitting semiconductor device as claimed in claim 5, wherein said gallium nitride based compound semiconductor bulk crystal layer comprises an AlGaN bulk crystal layer.

7. The light-emitting semiconductor device as claimed in claim 1, wherein each of said first-side and second-side cladding layers comprises a gallium nitride based compound semiconductor super-lattice layer.

8. The light-emitting semiconductor device as claimed in claim 7, wherein said gallium nitride based compound semiconductor super-lattice layer comprises multiple periods of alternating laminations of a GaN layer and an AlGaN layer.

9. The light-emitting semiconductor device as claimed in claim 1, wherein the following additional equation is further satisfied:

$$0.21y - 0.42 \leq d2 + h,$$

where "d2" (micrometers) represents a thickness of said second-side cladding layer.

10. The light-emitting semiconductor device as claimed in claim 1, wherein said four equations are satisfied at least in the vicinity of a center position of a laser beam intensity distribution in said active layer in a plane view parallel to interfaces of said nitride based compound semiconductor multi-layer structure.

11. A light-emitting semiconductor device including:
a nitride based compound semiconductor multilayer structure which further includes:
an active layer;
a first-side cladding layer under said active layer;
a second-side cladding layer over said active layer; and
at least one of a first-side optical guide layer over said first-side cladding layer and under said active layer and a second-side optical guide layer over said active layer and under said second-side cladding layer,
wherein the following four equations are satisfied:

$$0.15 \leq h;$$

$$|x-y| \leq 0.02;$$

$$0.02 \leq x \leq 0.06; \text{ and}$$

$$0.21y - 0.42 \leq d2 + h,$$

where "h" (micrometers) represents a total thickness of said at least one of said first-side and second-side optical guide layers; "d2" (micrometers) represents a thickness of said second-side cladding layer; "x" represents a first Al-index of a first AlGaN bulk crystal which has a first refractive index equal to a first averaged refractive index of said first-side cladding layer; and "y" represents a second Al-index of a second AlGaN bulk crystal which has a second refractive index equal to a second averaged refractive index of said second-side cladding layer.

12. The light-emitting semiconductor device as claimed in claim 11, wherein said first-side and second-side cladding layers provide, in combination, a generally symmetrical distribution of refractive index in a direction vertical to interfaces of said nitride based compound semiconductor multilayer structure.

13. The light-emitting semiconductor device as claimed in claim 11, wherein said light-emitting semiconductor device emits a laser beam with a wavelength in a range of 380 nanometers to 420 nanometers.

14. The light-emitting semiconductor device as claimed in claim 11, wherein said nitride based compound semiconductor multilayer structure extends over a substrate comprising one selected from the group consisting of GaN and AlGaN.

15. The light-emitting semiconductor device as claimed in claim 11, wherein each of said first-side and second-side cladding layers comprises a gallium nitride based compound semiconductor bulk crystal layer.

16. The light-emitting semiconductor device as claimed in claim 15, wherein said gallium nitride based compound semiconductor bulk crystal layer comprises an AlGaN bulk crystal layer.

17. The light-emitting semiconductor device as claimed in claim 11, wherein each of said first-side and second-side cladding layers comprises a gallium nitride based compound semiconductor super-lattice layer.

18. The light-emitting semiconductor device as claimed in claim 17, wherein said gallium nitride based compound semiconductor super-lattice layer comprises multiple periods of alternating laminations of a GaN layer and an AlGaN layer.

19. The light-emitting semiconductor device as claimed in claim 11, wherein the following additional equation is further satisfied:

$$0.34x - 0.49 \leq d1 + 2h,$$

where "d1" (micrometers) represents a thickness of said first-side cladding layer.

20. The light-emitting semiconductor device as claimed in claim 11, wherein said four equations are satisfied at least in the vicinity of a center position of a laser beam intensity distribution in said active layer in a plane view parallel to interfaces of said nitride based compound semiconductor multi-layer structure.

21. A light-emitting semiconductor device including:
a nitride based compound semiconductor multilayer structure which further includes:
an active layer;
a first-side cladding layer under said active layer;
a second-side cladding layer over said active layer; and
at least one of a first-side optical guide layer over said first-side cladding layer and under said active layer and a second-side optical guide layer over said active layer and under said second-side cladding layer,
wherein the following four equations are satisfied:

$$0.15 \leq h;$$

$$y - x > 0.02;$$

$$0.03 \leq x \leq 0.06; \text{ and}$$

$$0.47x - 0.5 \leq d1 + 4h,$$

where "h" (micrometers) represents a total thickness of said at least one of said first-side and second-side optical guide layers; "d1" (micrometers) represents a thickness of said first-side cladding layer; "x" represents a first Al-index of a first AlGaN bulk crystal which has a first refractive index equal to a first averaged refractive index of said first-side cladding layer; and "y" represents a second Al-index of a second AlGaN bulk crystal which has a second refractive index equal to a second averaged refractive index of said second-side cladding layer.

22. The light-emitting semiconductor device as claimed in claim 21, wherein said first-side and second-side cladding layers provide, in combination, a generally asymmetrical distribution of refractive index in a direction vertical to interfaces of said nitride based compound semiconductor multilayer structure.

23. The light-emitting semiconductor device as claimed in claim 21, wherein said light-emitting semiconductor device emits a laser beam with a wavelength in a range of 380 nanometers to 420 nanometers.

24. The light-emitting semiconductor device as claimed in claim 21, wherein said nitride based compound semiconductor multilayer structure extends over a GaN base layer.

25. The light-emitting semiconductor device as claimed in claim 21, wherein each of said first-side and second-side cladding layers comprises a gallium nitride based compound semiconductor bulk crystal layer.

26. The light-emitting semiconductor device as claimed in claim 25, wherein said gallium nitride based compound semiconductor bulk crystal layer comprises an AlGaN bulk crystal layer.

27. The light-emitting semiconductor device as claimed in claim 21, wherein each of said first-side and second-side cladding layers comprises a gallium nitride based compound semiconductor super-lattice layer.

28. The light-emitting semiconductor device as claimed in claim 27, wherein said gallium nitride based compound semiconductor super-lattice layer comprises multiple periods of alternating laminations of a GaN layer and an AlGaN layer.

29. The light-emitting semiconductor device as claimed in claim 21, wherein the following additional equation is further satisfied:

$$0.2y - 0.33 \leq d2 + 0.5h,$$

where "d2" (micrometers) represents a thickness of said second-side cladding layer.

30. The light-emitting semiconductor device as claimed in claim 21, wherein said four equations are satisfied at least in the vicinity of a center position of a laser beam intensity distribution in said active layer in a plane view parallel to interfaces of said nitride based compound semiconductor multi-layer structure.

31. A light-emitting semiconductor device including:
a nitride based compound semiconductor multilayer structure which further includes:
an active layer;
a first-side cladding layer under said active layer;
a second-side cladding layer over said active layer; and
at least one of a first-side optical guide layer over said first-side cladding layer and under said active layer and a second-side optical guide layer over said active layer and under said second-side cladding layer,
wherein the following four equations are satisfied:

$$0.15 \leq h;$$

$$y - x > 0.02;$$

$$0.03 \leq x \leq 0.06; \text{ and}$$

$$0.2y - 0.33 \leq d2 + 0.5h,$$

where "h" (micrometers) represents a total thickness of said at least one of said first-side and second-side optical guide layers; "d2" (micrometers) represents a thickness of said second-side cladding layer; "x" represents a first Al-index of a first AlGaN bulk crystal which has a first refractive index equal to a first averaged refractive index of said first-side cladding layer; and "y" represents a second Al-index of a second AlGaN bulk crystal which has a second refractive index equal to a second averaged refractive index of said second-side cladding layer.

32. The light-emitting semiconductor device as claimed in claim 31, wherein said first-side and second-side cladding layers provide, in combination, a generally asymmetrical distribution of refractive index in a direction vertical to interfaces of said nitride based compound semiconductor multilayer structure.

33. The light-emitting semiconductor device as claimed in claim 31, wherein said light-emitting semiconductor device emits a laser beam with a wavelength in a range of 380 nanometers to 420 nanometers.

34. The light-emitting semiconductor device as claimed in claim 31, wherein said nitride based compound semiconductor multilayer structure extends over a substrate comprising one selected from the group consisting of GaN and AlGaN.

35. The light-emitting semiconductor device as claimed in claim 31, wherein each of said first-side and second-side cladding layers comprises a gallium nitride based compound semiconductor bulk crystal layer.

36. The light-emitting semiconductor device as claimed in claim 35, wherein said gallium nitride based compound semiconductor bulk crystal layer comprises an AlGaN bulk crystal layer.

37. The light-emitting semiconductor device as claimed in claim 31, wherein each of said first-side and second-side cladding layers comprises a gallium nitride based compound semiconductor super-lattice layer.

38. The light-emitting semiconductor device as claimed in claim 37, wherein said gallium nitride based compound semiconductor super-lattice layer comprises multiple periods of alternating laminations of a GaN layer and an AlGaN layer.

39. The light-emitting semiconductor device as claimed in claim 31, wherein the following additional equation is further satisfied:

$$0.47x - 0.5 \leq d1 + 4h,$$

where "d1" (micrometers) represents a thickness of said first-side cladding layer.

40. The light-emitting semiconductor device as claimed in claim 31, wherein said four equations are satisfied at least in the vicinity of a center position of a laser beam intensity distribution in said active layer in a plane view parallel to interfaces of said nitride based compound semiconductor multi-layer structure.

41. A light-emitting semiconductor device including:
a gallium nitride based compound semiconductor base layer; and
a nitride based compound semiconductor multilayer structure over said gallium nitride based compound semiconductor base layer, and said nitride based compound semiconductor multilayer structure further including:
an active layer;
a first-side cladding layer under said active layer;
a second-side cladding layer over said active layer; and
at least one of a first-side optical guide layer over said first-side cladding layer and under said active layer and a second-side optical guide layer over said active layer and under said second-side cladding layer,
wherein a vertical radiation angle of a laser beam emitted from said light-emitting semiconductor device is not more than 20 degrees, and further the following equation is satisfied:

$$\frac{\sqrt{n_s^2 - n_e^2}}{n_e} \cdot \frac{4(n_e^2 - n_c^2)}{n_s^2 - n_c^2} \cdot \left[ |f(z_0)|^2 \Big/ \int_{-\infty}^{+\infty} f^*(z)f(z)dz \right] \leq 2 \text{ cm}^{-1} \quad (7)$$

where "$n_s$" represents a refractive index of said gallium nitride based compound semiconductor base layer; "$n_c$" represents an averaged refractive index of said first-side cladding layer; "$n_e$" represents a waveguide mode equivalent refractive index; "z" represents a coordinate axis along a direction vertical to interfaces of said nitride based compound semiconductor multilayer structure, provided a positive direction of said coordinate axis is toward said gallium nitride based compound semiconductor base layer, "f(z)" represents a function in z-coordinate system of a field distribution of laser beam, and "$z_0$" represents a position projected on said z-coordinate axis of a first interface of said first-side cladding layer, provided said first interface is closer to said gallium nitride based compound semiconductor base layer.

42. The light-emitting semiconductor device as claimed in claim 41, wherein each of said first-side and second-side cladding layers comprises a gallium nitride based compound semiconductor bulk crystal layer.

43. The light-emitting semiconductor device as claimed in claim 42, wherein said gallium nitride based compound semiconductor bulk crystal layer comprises an AlGaN bulk crystal layer.

44. The light-emitting semiconductor device as claimed in claim 41, wherein said gallium nitride based compound semiconductor base layer comprises a GaN base layer.

45. The light-emitting semiconductor device as claimed in claim 41, wherein said equation is satisfied at least in the vicinity of a center position of a laser beam intensity distribution in said active layer in a plane view parallel to interfaces of said nitride based compound semiconductor multi-layer structure.

46. A light-emitting semiconductor device including:
   a gallium nitride based compound semiconductor substrate;
   a nitride based compound semiconductor multilayer structure over said gallium nitride based compound semiconductor substrate, and said nitride based compound semiconductor multilayer structure further including:
   an active layer;
   a first-side cladding layer under said active layer;
   a second-side cladding layer over said active layer; and
   at least one of a first-side optical guide layer over said first-side cladding layer and under said active layer and a second-side optical guide layer over said active layer and under said second-side cladding layer; and
   a second-side electrode closer to said second-side cladding layer than said active layer,
   wherein a vertical radiation angle of a laser beam emitted from said light-emitting semiconductor device is not more than 20 degrees, and further the following equation is satisfied:

$$3 \cdot \alpha_{metal} \cdot \Gamma_p \leq 5 \ cm^{-1} \qquad (8)$$

where "$\alpha$metal" represents an optical absorption coefficient of said second-side electrode, and "$\Gamma$p" represents a waveguide mode optical confinement coefficient of said second-side electrode.

47. The light-emitting semiconductor device as claimed in claim 46, wherein said gallium nitride based compound semiconductor substrate comprises one selected from the group consisting of GaN and AlGaN.

48. The light-emitting semiconductor device as claimed in claim 46, wherein each of said first-side and second-side cladding layers comprises a gallium nitride based compound semiconductor super-lattice layer.

49. The light-emitting semiconductor device as claimed in claim 48, wherein said gallium nitride based compound semiconductor super-lattice layer comprises multiple periods of alternating laminations of a GaN layer and an AlGaN layer.

50. The light-emitting semiconductor device as claimed in claim 46, wherein said equation is satisfied at least in the vicinity of a center position of a laser beam intensity distribution in said active layer in a plane view parallel to interfaces of said nitride based compound semiconductor multi-layer structure.

* * * * *